US008638481B2

(12) United States Patent
Miyadera et al.

(10) Patent No.: US 8,638,481 B2
(45) Date of Patent: Jan. 28, 2014

(54) OPTICAL WRITING CONTROL APPARATUS FOR CONTROLLING A LIGHT SOURCE EMITTING A LIGHT BEAM ONTO A PHOTOSENSITIVE MEMBER AND CONTROL METHOD USING THE SAME

(75) Inventors: Tatsuya Miyadera, Osaka (JP); Yoshinori Shirasaki, Osaka (JP); Tomohiro Ohshima, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 264 days.

(21) Appl. No.: 13/044,863

(22) Filed: Mar. 10, 2011

(65) Prior Publication Data

US 2011/0228364 A1 Sep. 22, 2011

(30) Foreign Application Priority Data

Mar. 17, 2010 (JP) ................................ 2010-061002

(51) Int. Cl.
*G03F 3/08* (2006.01)

(52) U.S. Cl.
USPC ............ 358/518; 358/1.9; 358/2.1; 358/519; 358/523

(58) Field of Classification Search
USPC .................................................. 358/1.1–3.29
See application file for complete search history.

(56) References Cited

U.S. PATENT DOCUMENTS

2008/0075484 A1* 3/2008 Komiya .......................... 399/39
2008/0273902 A1 11/2008 Maeda

FOREIGN PATENT DOCUMENTS

| | | |
|---|---|---|
| JP | 2001-066842 | 3/2001 |
| JP | 2006-330686 | 12/2006 |
| JP | 2008-151855 | 7/2008 |
| JP | 2008-299311 | 12/2008 |
| JP | 2009-186897 | 8/2009 |

OTHER PUBLICATIONS

Japanese Office Action dated Oct. 22, 2013.

* cited by examiner

*Primary Examiner* — Qian Yang
*Assistant Examiner* — Marcellus Augustin
(74) *Attorney, Agent, or Firm* — IPUSA, PLLC

(57) ABSTRACT

An optical writing control apparatus controls a light source to draw a correction pattern for correcting a parameter value of an image forming mechanism, detects the correction pattern transferred onto a conveyance member from a photosensitive member based on an output signal of a sensor, and corrects the parameter value based on the detected correction pattern; stores chromatic color progress information indicating a progress for a chromatic color mechanism corresponding to a chromatic color image occurring from when the correction operation was carried out and achromatic color progress information indicating a progress for an achromatic color mechanism corresponding to an achromatic color image occurring from when the correction operation was carried out; and stores a necessary threshold to determine that the correction operation is necessary and an unnecessary threshold to determine that the correction operation is unnecessary for the chromatic color progress information and the achromatic color progress information.

14 Claims, 17 Drawing Sheets

FIG.7

WRITING START TIMING REFERENCE VALUE
DRUM INTERVAL REFERENCE VALUE
DENSITY GRADATION REFERENCE VALUE
.
.
.

FIG.14

| | |
|---|---|
| OUTPUT NUMBER OF SHEETS COUNT VALUES | |
| AFTER MONOCHROME POSITION ERROR CORRECTION EXECUTION | : ＊＊ SHEETS |
| AFTER COLOR POSITION ERROR CORRECTION EXECUTION | : ＊＊ SHEETS |
| AFTER MONOCHROME GRADATION CORRECTION EXECUTION | : ＊＊ SHEETS |
| AFTER COLOR GRADATION CORRECTION EXECUTION | : ＊＊ SHEETS |
| CORRECTION OPERATION SWITCHING THRESHOLDS | |
| POSITION ERROR CORRECTION EXECUTION NECESSARY THRESHOLD | : 120 SHEETS |
| POSITION ERROR CORRECTION EXECUTION UNNECESSARY THRESHOLD | : 100 SHEETS |
| GRADATION CORRECTION EXECUTION NECESSARY THRESHOLD | : 200 SHEETS |
| GRADATION CORRECTION EXECUTION UNNECESSARY THRESHOLD | : 180 SHEETS |

· · ·

FIG.15

| | | OUTPUT COUNT NUMBER OF SHEETS AFTER COLOR GRADATION CORRECTION EXECUTION | | |
|---|---|---|---|---|
| | | 200 SHEETS OR MORE | 180 SHEETS OR MORE AND LESS THAN 200 SHEETS | LESS THAN 180 SHEETS |
| OUTPUT COUNT NUMBER OF SHEETS AFTER MONOCHROME GRADATION CORRECTION EXECUTION | 200 SHEETS OR MORE | (a) FULL COLOR GRADATION CORRECTION | (b) FULL COLOR GRADATION CORRECTION | (c) MONOCHROME GRADATION CORRECTION |
| | 180 SHEETS OR MORE AND LESS THAN 200 SHEETS | (d) FULL COLOR GRADATION CORRECTION | (e) NO CORRECTION | (f) NO CORRECTION |
| | LESS THAN 180 SHEETS | (g) COLOR GRADATION CORRECTION | (h) NO CORRECTION | (i) NO CORRECTION |

FIG.16

| | | OUTPUT COUNT NUMBER OF SHEETS AFTER COLOR POSITION ERROR CORRECTION EXECUTION | | |
|---|---|---|---|---|
| | | 120 SHEETS OR MORE | 100 SHEETS OR MORE AND LESS THAN 120 SHEETS | LESS THAN 100 SHEETS |
| OUTPUT COUNT NUMBER OF SHEETS AFTER MONOCHROME POSITION ERROR CORRECTION EXECUTION | 120 SHEETS OR MORE | (a) FULL COLOR POSITION ERROR CORRECTION | (b) FULL COLOR POSITION ERROR CORRECTION | (c) MONOCHROME POSITION ERROR CORRECTION |
| | 100 SHEETS OR MORE AND LESS THAN 120 SHEETS | (d) FULL COLOR POSITION ERROR CORRECTION | (e) NO CORRECTION | (f) NO CORRECTION |
| | LESS THAN 100 SHEETS | (g) COLOR POSITION ERROR CORRECTION | (h) NO CORRECTION | (i) NO CORRECTION |

OPTICAL WRITING CONTROL APPARATUS FOR CONTROLLING A LIGHT SOURCE EMITTING A LIGHT BEAM ONTO A PHOTOSENSITIVE MEMBER AND CONTROL METHOD USING THE SAME

BACKGROUND OF THE INVENTION

1. Field of the Invention

The present invention relates to an optical writing control apparatus and a control method of an optical writing apparatus, and, in particular, to reduction of downtime that occurs for carrying out adjustment of the optical writing apparatus.

2. Description of the Related Art

Recently, computerization is promoted and an image processing apparatus such as a printer and a facsimile machine to be used for outputting computerized information and a scanner or such to be used for computerizing documents may become an indispensable apparatus. Such an image processing apparatus may be, in many cases, a MFP (MultiFunction Peripheral) that is useable as a printer, a facsimile machine, a scanner and a copier by having an imaging function, an image forming function, a communication function and so forth in a single machine.

As an image forming apparatus that is one of such image processing apparatuses and is used to output computerized documents, an image forming apparatus in an electrophotographic type is widely used. The image forming apparatus of the electrophotographic type is such that an electrostatic latent image is drawn on a photosensitive member as a result of the photosensitive member being exposed, a toner image is formed as a result of the electrostatic latent image being developed by using developer such as toner, the toner image is transferred to paper and thus, the image is output as being formed on the paper.

In the image forming apparatus of the electrophotographic type, adjustment is carried out such that the image is formed at a precise position on the paper as a result of timing of exposing the photosensitive member and drawing the electrostatic latent image are made to be coincident with timing of conveying the paper. Further, in an image forming apparatus of a tandem type in which plural photosensitive members are used to form a color image, adjustment of exposure timing between the photosensitive members of respective colors is carried out such that images developed on the photosensitive members for the respective colors are superposed on each other precisely (see Patent Document 1: Japanese Laid-Open Patent Application No. 2008-299311). Hereinafter, these adjustment processes will be generally referred to as position error correction.

As another adjustment operation in the image forming apparatus in the electrophotographic type, there is an operation (hereinafter, referred to as gradation correction) of adjusting a gradation of an image to be formed, i.e., densities of the image. In the gradation correction of an image, plural adjustment patterns having different densities are formed on the photosensitive member of each color, optical sensors are used to read the adjustment patterns, and bias voltages (i.e., development bias) of the photosensitive members (drums) are adjusted so that appropriate gradation is obtained.

In correction of drawing parameters (hereinafter, referred to as drawing parameter correction) such as the position error correction and the gradation correction described above, toner is consumed since the adjustment patterns, i.e., patterns for the adjustment, are formed. Further, the drawing parameter correction may be carried out, for example, at a time of power being turned on in the image forming apparatus, at a time of returning from a power saving mode, or before carrying out forming and outputting an image. In a case where the drawing parameter correction is carried out before forming and outputting, for example, a monochrome image, the drawing parameter correction for the other colors is not necessary. If drawing parameter correction for the other colors is carried out, the toner is consumed as mentioned above, and the toner of the colors other than black is uselessly consumed.

An image forming apparatus has been proposed (see Patent Document 2: Japanese Laid-Open Patent Application No. 2008-151855) as technology to control such useless consumption of color toner in which switching can be made between a monochrome control mode in which gradation correction is carried out only for black toner and a color control mode in which gradation correction is carried out for full color.

In a case of using the technology disclosed by Patent Document 2, both the gradation correction only for black toner and the gradation correction for full color may be carried out within a short span of time when a job for forming and outputting an image of full color is input and the gradation correction for full color is carried out immediately after the gradation correction only for black toner is carried out in the monochrome control mode and an image of monochrome is formed and output.

If so, since the gradation correction for full color includes the gradation correction for black color, the gradation correction for black color is carried out duplicately within the short span of time, and thus, toner is uselessly consumed for drawing the adjustment patterns in the gradation correction. Further, a ratio of an adjustment period of time with respect to a working period of time of the image forming apparatus, i.e., downtime, increases, and thus availability of the image forming apparatus may be degraded. It is noted that such a problem may occur not only on the gradation correction but also on other drawing parameter correction such as the position error correction and so forth.

SUMMARY OF THE INVENTION

According to an embodiment of the present invention, an optical writing control apparatus controls a light source emitting a light beam onto a photosensitive member to cause the light source to draw an electrostatic latent image on the photosensitive member in an image forming apparatus that develops the electrostatic latent image drawn on the photosensitive member and forms an image. The optical writing control apparatus includes a parameter correction part that controls the light source to cause the light source to emit the light beam and draw a correction pattern (or adjustment pattern) used for a correction operation of correcting a parameter value of an image forming mechanism in the image forming apparatus, detects the correction pattern transferred onto a surface of a conveyance member based on an output signal of a sensor that obtains imaging information of the surface of the conveyance member onto which an image developed on the photosensitive member is transferred, and corrects the parameter value based on the detected correction pattern; a progress information storage part that stores chromatic color progress information indicating a progress having occurred from when the correction operation for a chromatic color mechanism of the image forming mechanism corresponding to a chromatic color image was carried out and achromatic color progress information indicating a progress having occurred from when the correction operation for an achromatic color mechanism of the image forming mechanism corresponding to an achromatic color image was carried out; and a threshold storage part that stores a necessary threshold used to determine that the correction operation is necessary and an unnecessary threshold used to determine that the correction operation is unnecessary for the chromatic color progress information and the achromatic color progress information.

According to another embodiment of the present invention, an optical writing control apparatus controls a light source emitting a light beam onto a photosensitive member to cause the light source to draw an electrostatic latent image on the photosensitive member in an image forming apparatus that develops the electrostatic latent image drawn on the photosensitive member and forms an image. A control method of the optical writing control apparatus includes controlling the light source to cause the light source to emit the light beam and draw a correction pattern (or adjustment pattern) used for a correction operation of correcting a parameter value of an image forming mechanism of the image forming apparatus, detecting the correction pattern transferred onto a surface of a conveyance member based on an output signal of a sensor that obtains imaging information of the surface of the conveyance member onto which an image developed on the photosensitive member is transferred, and correcting the parameter value based on the detected correction pattern; storing chromatic color progress information indicating a progress having occurred from when the correction operation for a chromatic color mechanism of the image forming mechanism corresponding to a chromatic color image was carried out and achromatic color progress information indicating a progress having occurred from when the correction operation for an achromatic color mechanism of the image forming mechanism corresponding to an achromatic color image was carried out; and storing a necessary threshold used to determine that the correction operation is necessary and an unnecessary threshold used to determine that the correction operation is unnecessary for the chromatic color progress information and the achromatic color progress information.

Other objects, features and advantages of the present invention will become more apparent from the following detailed description when read in conjunction with the accompanying drawings.

BRIEF DESCRIPTION OF THE DRAWINGS

FIG. 7 shows information stored in a reference value storage part according to the embodiment of the present invention;

FIG. 14 shows information stored in the writing control part according to the embodiment of the present invention;

FIG. 15 shows a method of determining whether it is necessary to carry out gradation correction operation according to the embodiment of the present invention;

FIG. 16 shows a method of determining whether it is necessary to carry out position error correction operation according to the embodiment of the present invention;

DETAILED DESCRIPTION OF THE EMBODIMENTS

An embodiment of the present invention has been devised in consideration of the above-mentioned circumstances, and an object of the embodiment is to reduce consumption of developer in an operation of adjustment (or correction) of an optical writing apparatus included in an image forming apparatus and to shorten downtime.

Below, with reference to figures, the embodiment of the present invention will be described in detail. As the embodiment, an image forming apparatus in a form of an MFP will be described for example. The image forming apparatus according to the embodiment is an image forming apparatus of the electrophotographic type, and an object of the embodiment is to reduce consumption of developer in an operation of adjustment (or correction) of parameters in an optical writing apparatus that draws an electrostatic latent image on a photosensitive member included in an image forming apparatus and to shorten downtime.

Figure 1:
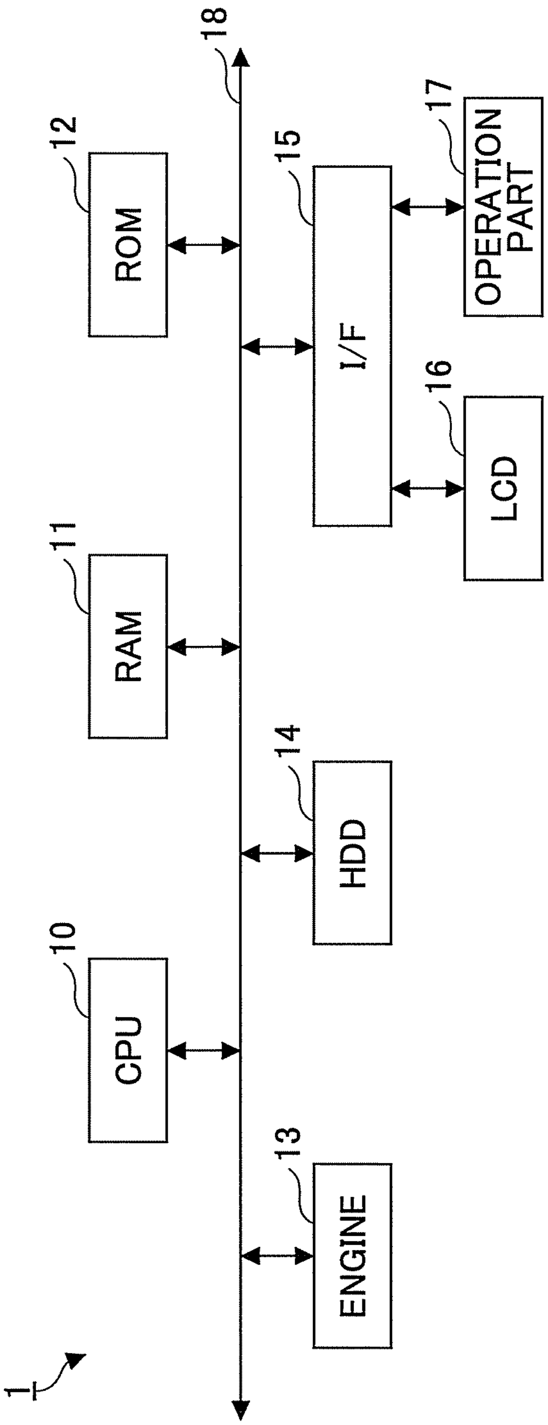
FIG. 1 is a block diagram showing a hardware configuration of an image forming apparatus according to an embodiment of the present invention.

FIG. 1 is a block diagram showing a hardware configuration of the image forming apparatus according to the embodiment. As shown in FIG. 1, the image forming apparatus 1 according to the embodiment includes, in addition to the same configuration as that of an information processing terminal such as a common server or PC (Personal Computer), an engine that carries out forming an image. That is, the image forming apparatus 1 is such that a CPU (Central Processing Unit) 10, a RAM (Random Access Memory) 11, a ROM (Read Only Memory) 12, the engine 13, a HDD (Hard Disk Drive) 14 and an I/F (Interface) 15 are connected together by a bus 18. Further, to the I/F 15, an LCD (Liquid Crystal Display) 16 and an operation part 17 are connected.

The CPU 10 is an operation part, and controls the entirety of the image forming apparatus 1. The RAM 11 is a volatile recording medium for which it is possible to read and write information at high speed, and is used by the CPU 10 as a work area for processing information. The ROM 12 is a non-volatile recording medium for which only reading information is possible, and stores a program such as firmware. The engine 13 is a mechanism that actually carries out forming an image in the image forming apparatus 1.

The HDD 14 is a non-volatile recording medium for which reading and writing of information is possible, and stores an OS (Operating System), various control programs, application programs and so forth. The I/F 15 connects between the bus 18 and various types of hardware and a communication network. The LCD 16 is a visual user interface for the user to check states of the image forming apparatus 1. The operation part 17 is a user interface such as a keyboard, a mouse and so forth for the user to input information into the image forming apparatus 1.

In such a hardware configuration, a program stored in a recording medium such as the ROM 12, the HDD 14 or an optical disk (not shown) is read into the RAM 11, and the CPU 10 operates according to the program. Thus, a software control part is provided. Functional blocks of the image forming apparatus 1 that achieve functions of the image forming apparatus 1 are provided by combination of the software control part and the hardware.

Figure 2:
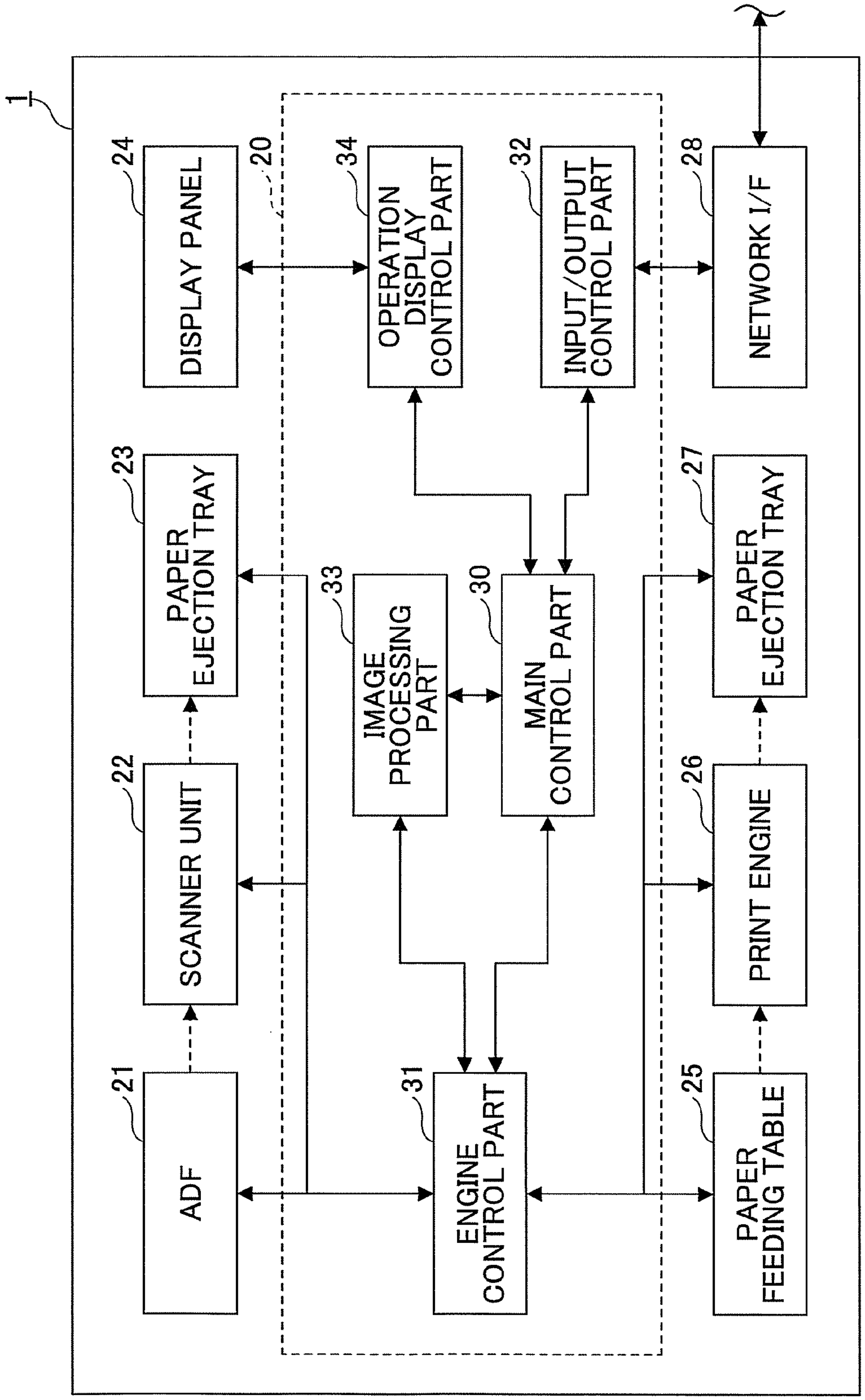
FIG. 2 shows a functional configuration of the image forming apparatus according to the embodiment of the present invention.

Next, with reference to FIG. 2, a functional configuration of the image forming apparatus 1 will be described. FIG. 2 is a block diagram showing the function configuration of the image forming apparatus 1. As shown in FIG. 2, the image forming apparatus 1 includes a controller 20, an ADF (Automatic Document Feeder) 110, a scanner unit 22, a paper ejection tray 23, a display panel 24, a paper feeding table 25, a print engine 26, a paper ejection tray 27 and a network I/F 28.

The controller 20 includes a main control part 30, an engine control part 31, an input/output control part 32, an image processing part 33 and an operation display control part 34. As shown in FIG. 2, the image forming apparatus 1 has a configuration of an MFP having the scanner unit 22 and the print engine 26. It is noted that in FIG. 2, solid arrows represent electric connections and broken arrows represent flows of paper.

The display panel 24 acts as an output interface to visually indicate states/conditions of the image forming apparatus 1, and also acts as an input interface (operation part) in a form of a touch panel used when the user directly operates the image forming apparatus 1 or inputs information into the image forming apparatus 1. The network I/F 28 is an interface to be used by the image forming apparatus 1 to communicate with another apparatus via a communication network, and an Ethernet (registered trademark) or USB (Universal Serial Bus) interface is used there.

The controller 20 is provided by a combination of software and hardware. Specifically, the controller 20 is provided by the software control part provided as a result of a control program such as firmware, stored in a non-volatile memory (hereinafter simply referred to as a memory) such as the ROM 12, a non-volatile memory, the HDD 14 or the optical disk, being loaded onto a non-volatile memory such as the RAM 11, and the CPU 10 operating according to the control program, and hardware such as an integrated circuit. The controller 20 acts as a control part that controls the entirety of the image forming apparatus 1.

The main control part 30 controls respective parts included in the controller 20, and gives instructions to the respective parts of the controller 20. The engine control part 31 acts as a driving part that controls and drives the print engine 26, the scanner unit 22 and so forth. The input/output control part 32 inputs signals and instructions that have been input via the network I/F 28 into the main control part 30. Further, the main control part 30 controls the input/output control part 32 and accesses another apparatus via the network I/F 28.

The image processing part 33 generates drawing information based on printing information included in a printing job that is input, under the control of the main control part 30. The drawing information is information that is used by the print engine 26 that acts as an image forming part to draw an image to be formed in an image forming operation. Further, the printing information included in the printing job is image information obtained from being converted by a printer driver installed in an information processing apparatus such as a PC into such a form that the image forming apparatus 1 can recognize. The operation display control part 34 carries out displaying information on the display panel 24 and provides information that is input via the display panel 24 to the main control part 30.

In a case where the image forming apparatus 1 acts as a printer, first the input/output control part 32 receives the printing job via the network I/F 28. The input/output control part 32 transfers the received printing job to the main control part 30. After receiving the printing job, the main control part 30 controls the image processing part 33, and causes the image processing part 33 to generate the drawing information based on the printing information included in the printing job.

After the drawing information is generated by the image processing part 33, the engine control part 31 carries out forming an image onto paper conveyed from the paper feeding table based on the drawing information. That is, the print engine 26 acts as the image forming part. A document in which the printer engine 26 has formed the image is then ejected to the paper ejection tray 27.

In a case where the image forming apparatus 1 acts as a scanner, in response to an operation made by the user from the display panel or a scan execution instruction that is input by an external PC or such via the network I/F 28, the operation display control part 34 or the input/output control part 32 transfers the scan execution signal to the main control part 30. The main control part 30 controls the engine control part 31 based on the received scan execution signal.

The engine control part 31 drives the ADF 21, and the ADF 21 conveys an original from which imaging information is to be obtained and which is set on the ADF 21, to the scanner unit 22. The engine control part 31 drives the scanner unit 22, and the scanner unit 22 obtains imaging information from the original. Further, in a case where no original is set on the ADF 21 and an original is directly set on the scanner unit 22, the scanner unit 22 obtains imaging information from the original under the control of the engine control part 31. That is, the scanner unit 22 acts as an imaging part.

In an imaging operation of obtaining the imaging information from the original, an imaging device such as a CCD (Charge Coupled Device) included in the scanner unit 22 optically scans the original, and the imaging information is generated based on thus-obtained optical information. The engine control part 33 transfers the imaging information thus generated by the scanner unit 22 to the image processing part 33. The image processing part 33 generates image information based on the imaging information received from the engine control part 31 under the control of the main control part 30. The image information generated by the image processing part 33 is stored in a recording medium such as the HOD 40 included in the image forming apparatus 1. That is, the scanner unit 22, the engine control part 31 and the image processing part 33 act as an original reading part in cooperation.

The image information generated by the image processing part 33 is stored in the HDD 40 or such, or is transmitted to an external apparatus via the input/output control part 32 and the network I/F 48 according to an instruction given by the user. That is, the ADF 21, the scanner unit 22 and the engine control part 31 act as an image inputting part.

In a case where the image forming apparatus 1 acts as a copier, the image processing part 33 generates drawing information based on imaging information that the engine control part 31 has received from the scanner unit 22 or image information that the image processing part has generated. Then, based on the drawing information, the same as the printer operation, the engine control part 31 drives the print engine 26.

Next, with reference to FIG. 3, the configuration of the print engine 26 according to the embodiment will be described. The print engine 26 has a configuration that image forming parts 106BK, 106M, 106C and 106Y of the respective colors are arranged along a conveyance belt 105 that is an endless moving part, and is of a so-called tandem type. That is, along the conveyance belt 105 that conveys paper (recording paper) separated and fed from a paper feeding tray 101 by a paper feeding roller 102 and a separation roller 103, the plural image forming parts (i.e., electrophotographic process parts) 106BK, 106M, 106C and 106Y are arranged in sequence from the upstream side of the conveyance direction in the stated order.

These plural image forming parts 106BK, 106M, 106C and 106Y have a common inner configuration except for the colors of toner images. The image forming part 106BK forms a black image; the image forming part 106M forms a magenta image; the image forming part 106C forms a cyan image; and the image forming part 106Y forms a yellow image. It is noted that hereinafter, the image forming part 106BK will be described specifically. The other image forming parts 106M, 106C and 106Y are similar to the image forming part 106BK. Therefore, for respective parts/components of the image forming parts 106M, 106C and 106Y, reference numerals distinguished by "M" "C" and "Y" are given instead of "BK" given to the corresponding parts/components of the image forming part 106BK, and duplicate description will be omitted.

The conveyance belt 105 is an endless belt wound between a driving roller 107 that is driven and rotated and a driven roller 108. The driving roller 107 is driven and rotated by a driving motor (not shown), and the driving motor, the driving roller 107 and the driven roller 108 act as a driving part that moves the conveyance belt 105.

When an image is formed, paper 104 is fed in sequence, sheet by sheet, from the top, from the paper feeding tray 101, and is conveyed to the first image forming part 106BK by the conveyance belt 105 that is driven and rotated, as the paper 104 is being attracted by the conveyance belt 105 because of an electrostatic attraction effect, and a black toner image is transferred to the conveyed paper 104. That is, the conveyance belt 105 acts as a conveyance member that conveys the paper to which the image is transferred.

The image forming part 106BK includes a photosensitive drum 109BK as a photosensitive member, and an electrification device 106BK, an optical writing apparatus 111, a development device 112BK, a photosensitive member cleaner (not shown), an electricity removal device 113BK and so forth which are arranged around the photosensitive drum 109BK. The optical writing apparatus 111 is configured to emit laser beams to the respective ones of the photosensitive drums 109BK, 109M, 109C and 109Y (hereinafter generally referred to as photosensitive drums 109).

When an image is formed, an outer circumferential surface of the photosensitive drum 109BK is uniformly electrified by the electrification device 110BK in the dark, then writing is carried out on the outer circumferential surface of the photosensitive drum 109BK by the laser beam corresponding to the black image from the optical writing apparatus 111, and thus an electrostatic latent image is formed on the outer circumferential surface of the photosensitive drum 109BK. The development device 112BK develops the electrostatic latent image by black toner to visualize it, and thus, the black toner image is formed on the photosensitive drum 109BK.

The toner image is transferred to the paper 104 by the function of a transfer device 115BK at a position (transfer position) at which the paper 104 on the conveyance belt 105 comes into contact with the photosensitive drum 109BK. By the transfer, the black toner image is formed on the paper 104. After the transfer of the toner image is thus finished, residual unnecessary toner on the outer circumferential surface of the photosensitive drum 109BK is wiped off by the photosensitive member cleaner, then, the electricity is removed from the photosensitive drum 109BK by the electricity removal device 113*b*, and the photosensitive drum 109BK is on standby for the next forming of an image.

The paper 104 onto which the black toner image has been thus transferred by the image forming part 106BK is conveyed to the next image forming part 106M by the conveyance belt 105. In the image forming part 106M, by the same process as that in the image forming part 106BK, a magenta toner image is formed on the photosensitive drum 109M and the toner image is then transferred and superposed on the black image having been formed on the paper 104.

The paper 104 is further transferred to the next image forming parts 106C and 106Y, a cyan toner image formed on the photosensitive drum 109C and a yellow toner image formed on the photosensitive drum 109Y are transferred and superposed on the paper 104 in the same operation. Thus, a full color image is formed on the paper 104. The paper 104 on which the full color image has been thus formed is removed from the conveyance belt 105, the full color image is fixed onto the paper 104 by a fixing device 116, and then, the paper 104 is ejected to the outside of the image forming apparatus 1.

In the image forming apparatus 1, an error in distances between the axes of the photosensitive drums 109BK, 109M, 109C and 109Y, an error in parallelism between the photosensitive drums 109BK, 109M, 109C and 109Y, an error of setting of a deflection mirror in the optical writing apparatus 111, a timing error in writing of electrostatic latent images to the photosensitive drums 109BK, 109M, 109C and 109Y, and so forth, may result in the toner images of the respective colors which are to be superposed at a position not being superposed at the position actually, and cause a position error between the respective colors.

Further, by the same causes, on the paper to which an image is to be transferred, the image may be transferred to an area other than an area to which the image is to be transferred. As factors causing such a position error, mainly a skew, an error in registration in the sub-scan direction, an error in magnification in the main scan direction, an error in registration in the main scan direction, and so forth are known. Further, expansion or contradiction of the conveyance belt 105 caused by a change in temperature in the image forming apparatus 1 or aging is known.

Further, in the image forming apparatus 1, density gradation or density balance between the respective colors of transferred images formed on the photosensitive drums 109BK, 109M, 109C and 109Y may not be in desired states. This is because development characteristics may vary because of conditions of temperature, humidity and so forth of the environment in which the image forming apparatus 1 operates.

In order to correct such a position error and density gradation, a pattern detection sensor 117 is provided. The pattern detection sensor 117 is an optical sensor to read position error correction patterns and gradation correction patterns (hereinafter generally referred to as correction patterns) transferred onto the conveyance belt 105 from the photosensitive drums 109BK, 109M, 109C and 109Y, and includes light emission devices that irradiate the correction patterns drawn on the surface of the conveyance belt 105 and light reception devices that receive reflection light from the correction patterns.

Figure 3:
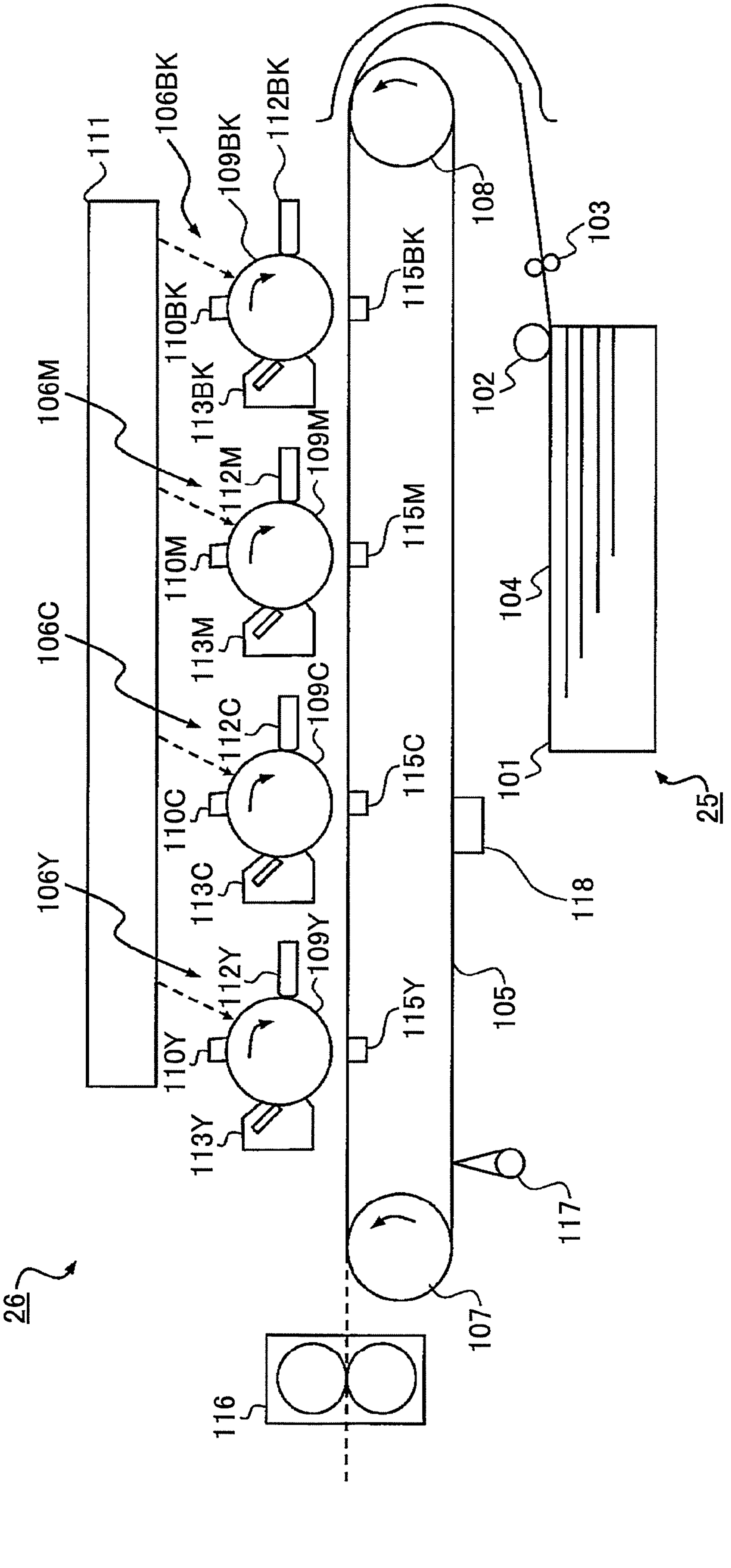
FIG. 3 shows a configuration of a print engine according to the embodiment of the present invention.

The pattern detection sensor 117 is supported by the same substrate along a direction perpendicular to the conveyance direction of the conveyance belt 105 on the downstream side of the photosensitive drums 109BK, 109M, 109C and 109Y as shown in FIG. 3. Details of the pattern detection sensor 117 and a method of position error correction and gradation correction will be described later. It is noted that each of position error correction and gradation correction is correction of parameters concerning the operation of forming electrostatic latent images on the photosensitive drums 109BK, 109M, 109C and 109Y and developing them, i.e., the operation of drawing images, and thus, hereinafter, will be generally referred to as drawing parameter correction.

A belt cleaner 118 is provided for removing toner of the correction patterns drawn on the conveyance belt 105 in the drawing parameter correction for preventing paper 104 conveyed by the conveyance belt 105 from being stained. The belt cleaner 118 is a cleaning blade that is pressed onto the conveyance belt 105 on the downstream side with respect to the pattern detection sensor 117 and on the upstream side with respect to the photosensitive drums 109, as shown in FIG. 3, and is a developer removal part that scrapes toner adhering to the surface of the conveyance belt 105.

Further, the belt cleaner 118 according to the embodiment has a function of collecting toner adhering to the conveyance belt 105 by applying a bias voltage. By applying the voltage having a polarity reverse to that of electric charge of the toner, it is possible to remove the toner adhering to the conveyance belt 105 and cause the toner to attract to the belt cleaner 118.

It is noted that in a case where the electric charge of the toner is such that positive and negative polarities are mixed, the belt cleaner 118 oscillates the bias voltage between the positive and negative polarities. Thereby, it is possible to remove the toner adhering to the conveyance belt 105 and cause the toner to attract to the belt cleaner 118 whether the toner has the positive or negative polarity.

Figure 4:
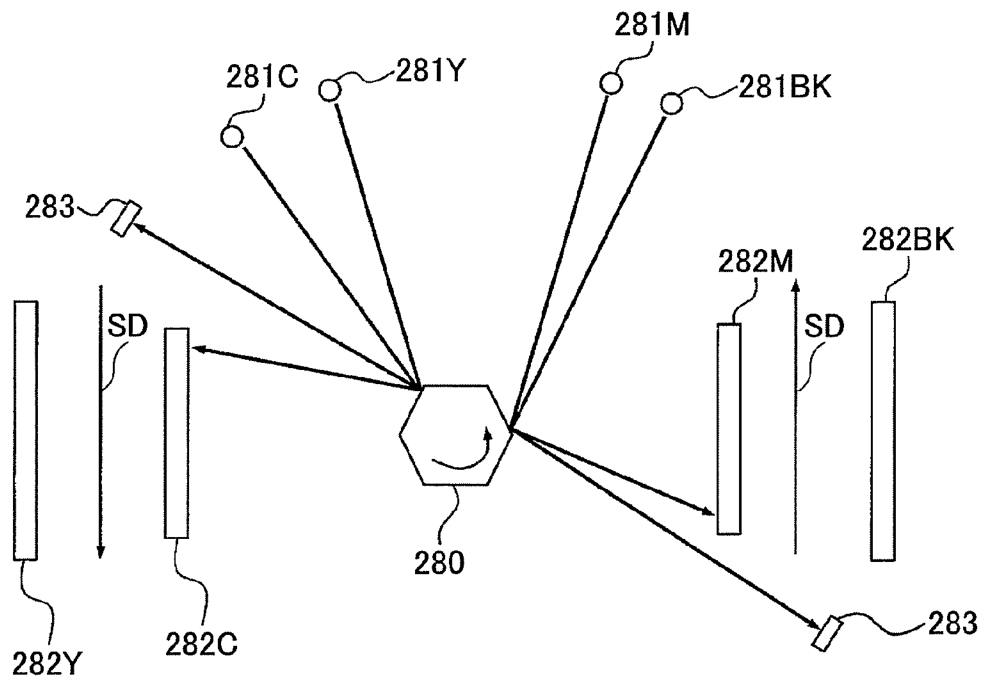
FIG. 4 is a plan view showing a configuration of an optical writing apparatus according to the embodiment of the present invention.
Figure 5:
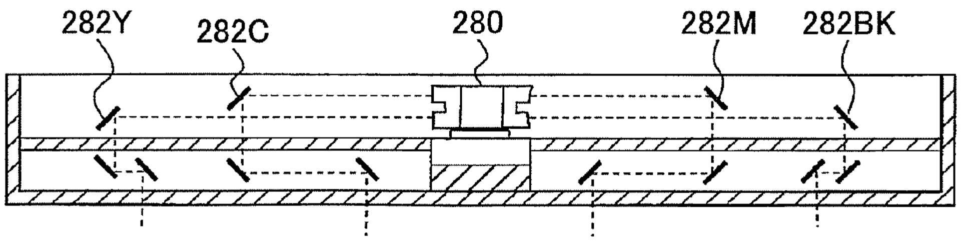
FIG. 5 is a side sectional view of the configuration of the optical writing apparatus according to the embodiment of the present invention.

Next, the optical writing apparatus 111 according to the embodiment will be described. FIG. 4 is a plan view of the optical writing apparatus 111 according to the embodiment viewed from the top. FIG. 5 is a sectional view of the optical writing apparatus 111 according to the embodiment viewed from the side. As shown in FIGS. 4 and 5, the laser beams for writing to the photosensitive drums 109BK, 109M, 109C and 109Y of the respective colors are emitted by light source apparatuses 281BK, 281M, 281C and 281Y which act as light sources (hereinafter, generally referred to as light source apparatuses 281). It is noted that the light source apparatuses 281 according to the embodiment include semiconductor lasers, collimator lenses, slits, prisms, cylinder lenses and so forth. In FIG. 4, SD denotes a scan direction.

The laser beams emitted by the light source apparatuses 281 are reflected by a reflection mirror (or deflection mirror) 280. The respective laser beams are led to respective mirrors 282BK, 282M, 282C and 282Y (hereinafter, generally referred to as 282) by optical systems such as fθ lenses (not shown), and are then caused to scan the surfaces of the respective photosensitive drums 109BK, 109M, 109C and 109Y by subsequent optical systems.

The reflection mirror 280 is a polygon mirror of a hexahedron, and can cause the laser beam to scan for a line of the main scan direction with each surface of the polygon mirror. The optical writing apparatus 111 according to the embodiment writes to the four different photosensitive drums simultaneously with a compact configuration, in comparison to a system of scanning by using only one reflection surface, according to a system that the four light source apparatuses 281BK, 281M, 281C and 281Y are divided into two groups each corresponding to two colors of the light source apparatuses and scanning is carried out by using different reflection surfaces of the reflection mirror 280.

Further, horizontal synchronization detection sensors 283 are provided near the positions from which scanning is started, in ranges scanned by the laser beams with the reflection mirror 280. The laser beams emitted by the light source apparatuses 281 are incident on the horizontal synchronization detection sensors 283, thereby the timings of starting the main scan lines are detected, and thus, the light source apparatuses 281 and the reflection mirror 280 are synchronized together.

Figure 6:
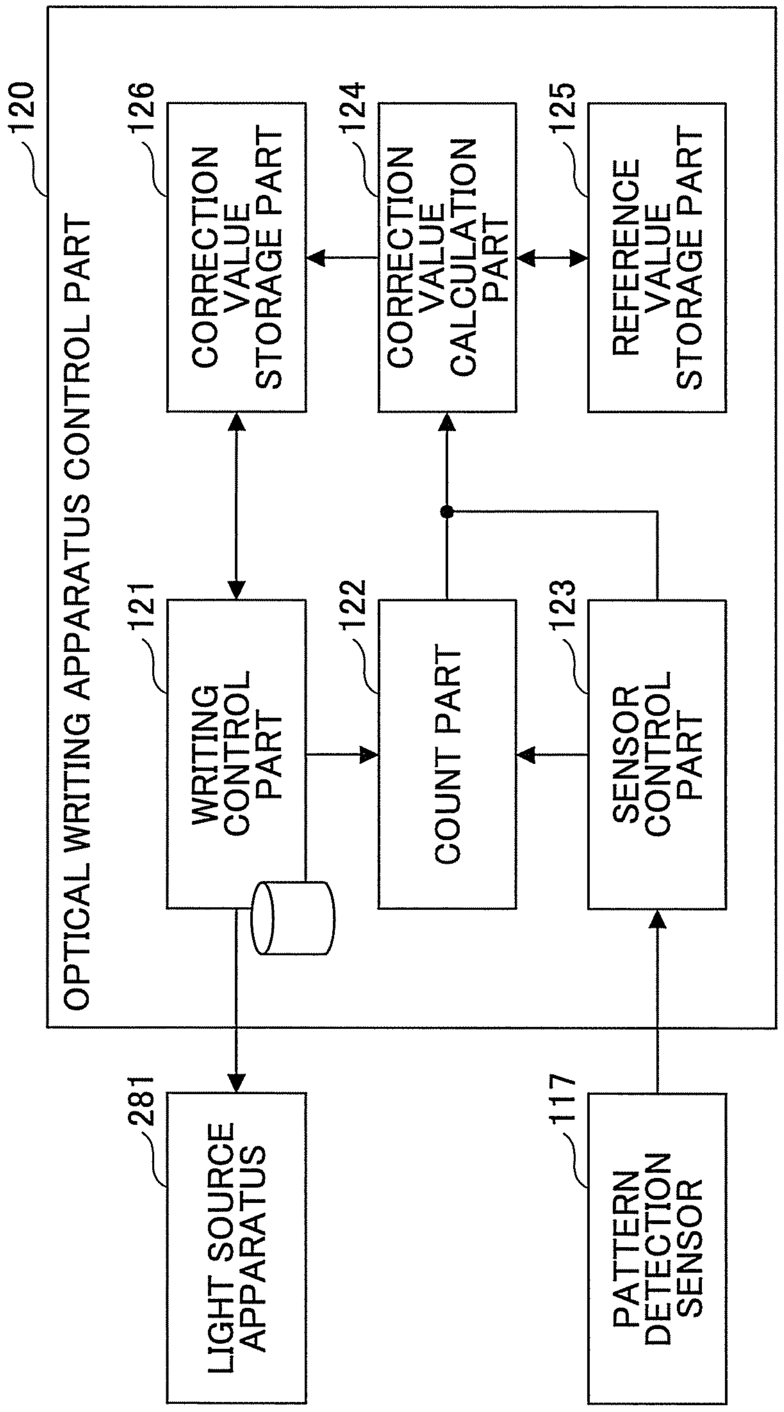
FIG. 6 is a block diagram showing a control part of the optical writing apparatus according to the embodiment of the present invention.

Next, control blocks of the optical writing apparatus 111 according to the embodiment will be described with reference to FIG. 6. FIG. 6 shows a functional configuration of an optical writing apparatus control part 120 that controls the optical writing apparatus 111, and a connection with the light source apparatuses 281 and the pattern detection sensor 117.

As shown in FIG. 6, the optical writing apparatus control part 120 according to the embodiment includes a writing control part 121, a count part 122, a sensor control part 123, a correction value calculation part 124, a reference value storage part 125 and a correction value storage part 126. It is noted that the optical writing apparatus 111 according to the embodiment includes an information processing mechanism such as a CPU 10, a RAM 11, a ROM 12, a HDD 14 and so forth described with reference to FIG. 1, and the optical writing apparatus control part 120 shown in FIG. 6 is configured as a result of, the same as the controller 20 of the image forming apparatus 1, a control program stored in the ROM 12 or the HDD 14 being loaded onto the RAM 12, and an operation being carried out under the control of the CPU 10 that executes the control program.

The writing control part 121 is a light source control part that controls the light source apparatuses 281 according to synchronization detection signals provided by the horizontal synchronization sensors 283 based on image information that is input from the engine control part 31 of the controller 20. Further, the writing control part 121 drives the light source apparatuses 281 for drawing the correction patterns in the above-described drawing parameter correction process in addition to driving the light source apparatuses 281 based on the image information that is input from the engine control part 31. Correction values that are generated as a result of the position error correction process of the drawing parameter correction process are stored in the correction value storage part 126 as position error correction values, and the writing control part 121 corrects timings of driving the light source apparatuses 281 based on the position error correction values stored in the correction value storage part 126.

Further, the writing control part 121 has a function of obtaining the detection signals from the horizontal synchronization detection sensors 283, and synchronizing with rotation of the reflection mirror 280 as described above with reference to FIG. 4. Further, the writing control part 121 functions as a voltage control part that controls, when developing the electrostatic latent images formed on the photosensitive drums 109 by using toner that is developer, voltages (hereinafter, referred to as bias voltages) to be applied between the photosensitive drums 109BK, 109M, 109C and 109Y and the development devices 112BK, 112M, 112C and 112Y. Also correction values generated by the gradation correction of the drawing parameter correction are stored in the correction value storage part 126 as gradation correction values, and the writing control part 121 corrects the bias voltages (i.e., development biases) based on the gradation correction values stored in the correction value storage part 126.

The count part 122 starts counting at the same time when the writing control part 121 controls the light source apparatus 281BK and starts exposure of the photosensitive drum 109BK. The count part 122 stops the counting as a result of the sensor control part 123 detecting the position error correction pattern based on the output signal of the pattern detention sensor 117. Thereby, the count part 122 functions as a detection time period count part that counts (i.e., measures) a detection period of time in the position error correction process from when the writing control part 121 controls the light source apparatus 281BK and starts exposure of the photosensitive drum 109BK up to when the pattern detection sensor 117 detects the position error correction pattern. Hereinafter, the count value (i.e., measured value) is referred to as a writing start count value. Further, the count part 122 counts (i.e., measures) timings of detecting patterns that are successively drawn in the position error correction process for correcting position errors of toner images of the respective colors. Hereinafter, these count values are referred to as drum interval count values.

The sensor control part 123 is a control part that controls the pattern detection sensor 117, and, as described above, is an arrival determination part that determines, based on the output signal of the pattern detection sensor 117, that the position error correction patterns formed on the conveyance belt 105 have arrived at the position of the pattern detection sensor 123. Further, the sensor control part 123 is a gradation determination part that determines the densities of the gradation correction patterns formed on the conveyance belt 105, based on the output signal of the pattern detection sensor 117.

The sensor control part 123 inputs a detection signal to the count part 122 when determining that the position error correction patterns have arrived at the position of the pattern detection sensor 117 as described above. Further, the sensor control part 123 inputs a signal indicating determined densities to the correction value calculation part 124 when determining the densities of the gradation correction patterns. That is, the sensor control part 123 acts as an image detection part.

Further, the sensor control part 123 has a function of controlling the pattern detection sensor 117, and adjusting the amounts of light of the light emission devices included in the pattern detection sensor 117. That is, the pattern detection sensor 117 acts as a light amount adjustment part. When adjusting the amounts of light of the light emission devices, the pattern detection sensor 117 drives the light emission devices with predetermined power, and irradiates the conveyance belt 105 in a state of a white background on which nothing has been drawn, for example. It is noted that a toner mark or such formed on the conveyance belt 105 may be used in the adjustment of the amounts of light of the light emission devices. Then, based on the output signals of the light reception devices having received reflection light from the white background of the conveyance belt 105, emission amounts of light of the light emission devices are determined and adjusted.

For example, when the output signals of the light reception devices are lower than a target value, the sensor control part 123 carries out the same process after increasing the driving power of the light emission devices. On the other hand, when the output signals of the light reception devices are higher than the target value, the sensor control part 123 carries out the same process after lowering the driving power of the light emission devices. As a result of the sensor control part 123 repeating the processes, the driving power of the light emission devices are adjusted so that the output signals of the light reception devices become the target value, and as a result, the emission amounts of light of the light emission devices are adjusted to appropriate levels.

As a result of the amounts of light reflected by the conveyance belt 105 being thus adjusted to a predetermined target value, S/N ratios of the light reception device are improved, and thus, it is possible to detect the position error correction patterns with high accuracy. This process of adjusting the amounts of light may be carried out when the position error correction process is carried out.

The correction value calculation part 124 calculates the correction values based on position error correction reference values stored in the reference value storage part 125 based on the count results of the count part 122. That is, the correction value calculation part 124 acts as a reference value obtaining part and a correction value calculation part. FIG. 7 shows example of the reference values stored in the reference value storage part 125. As shown in FIG. 7, in the reference value storage part 125, a writing start timing reference value, drum interval reference values and density gradation reference values are stored.

The writing start timing reference value is a reference value for the period of time from when the writing control part 121 controls the light source apparatus 281BK and starts exposure of the photosensitive drum 109BK up to when the pattern detection sensor 117 detects the position error correction pattern. That is, the correction value calculating part 124 compares the writing start count value of the count values of the count part 122 with the writing start timing reference value, and calculates the correction value for the error therebetween.

The drum interval reference values are reference values for the detection timings for detecting the respective ones of the patterns drawn successively as described above. That is, the correction value calculating part 124 compares the drum interval count values of the count values of the count part 122 with the drum interval reference values, and calculates the correction values for the errors therebetween.

The density gradation reference values are reference values for densities of respective ones of the gradation correction patterns drawn for the respective colors described above. That is, the correction value calculating part 124 compares the densities of the gradation correction patterns determined by the sensor control part 123 with the density gradation reference values, and calculates the correction values for the errors therebetween. The thus-calculated correction values are stored in the correction value storage part 126. As a result of the correction values being stored in the correction value storage part 126, the writing control part 121 reads the correction values, and drives the light source apparatuses 281 and the apparatuses that generate the development biases (i.e., the bias voltages).

It is noted that the optical writing apparatus 111 according to the embodiment has, in addition to the functions shown in FIG. 6, a function of controlling the driving roller 107 that rotates the conveyance belt 105 and a function of controlling the belt cleaner 118.

Figure 8:
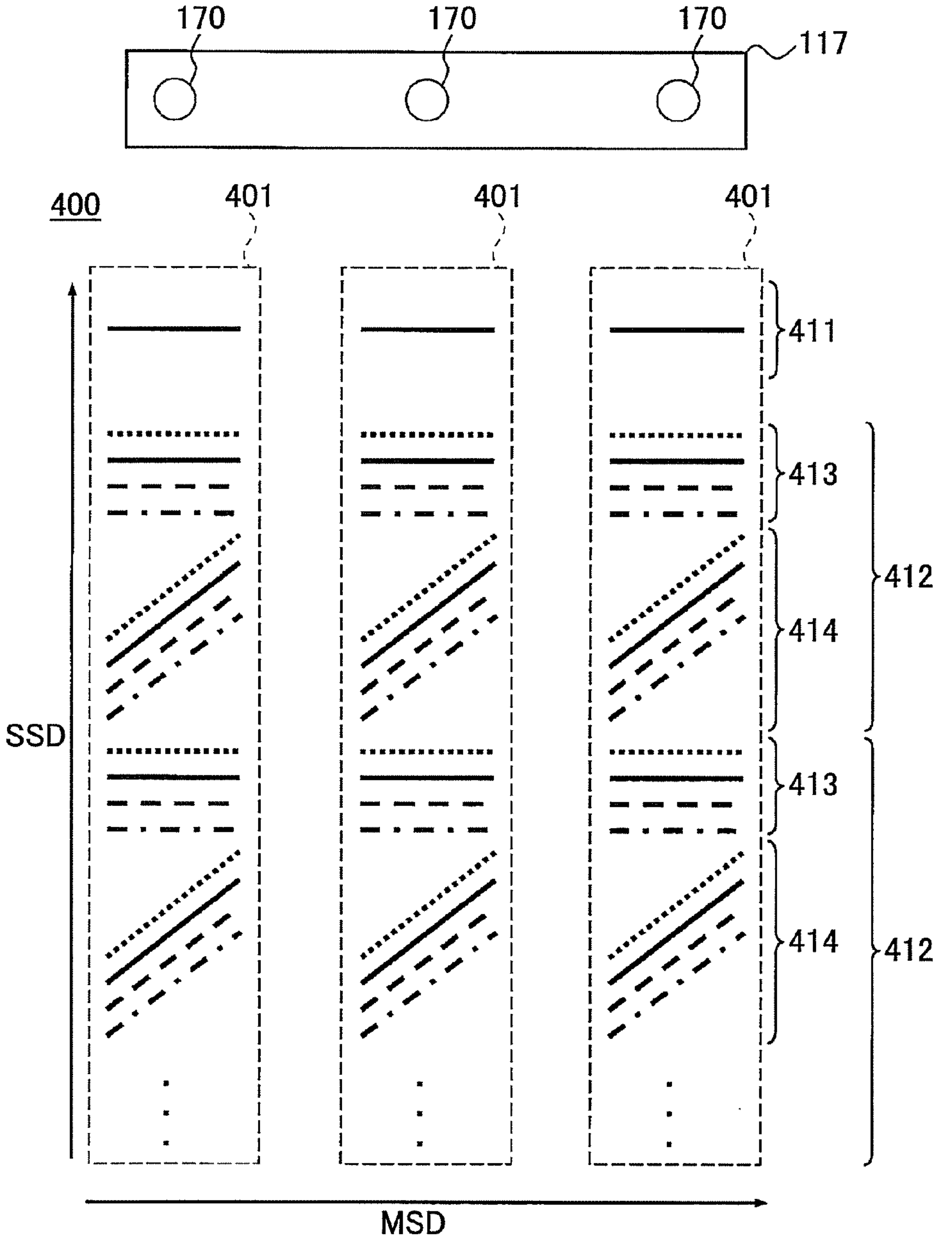
FIG. 8 shows an example of patterns drawn in a position error correction operation according to the embodiment of the present invention.

Next, with reference to FIG. 8, the position error correction operation according to the embodiment will be described. FIG. 8 shows marks (hereinafter, referred to as position error correction marks) drawn on the conveyance belt 105 by the light source apparatuses 281 that are controlled by the writing control part 121 in the position error correction operation according to the embodiment. As shown in FIG. 8, the position error correction marks 400 according to the embodiment are such that plural (in the embodiment, three) rows 401 of position error correction patterns that include various patterns arranged in the sub-scan direction are arranged in the main scan direction. It is noted that in FIG. 8, MSD denotes the main scan direction, and SSD denotes the sub-scan direction. It is noted that in FIG. 8, solid lines denote patterns drawn by the photosensitive drum 109BK; dotted lines denote patterns drawn by the photosensitive drum 109Y; broken lines denote patterns drawn by the photosensitive drum 109C; and dashed-dotted lines denote patterns drawn by the photosensitive drum 109M.

As shown in FIG. 8, the pattern detection sensor 117 has plural (in the embodiment, three) sensor devices 170 in the main scan direction, and the respective rows 401 of position error correction patterns are drawn on positions corresponding to the respective sensor devices 170. Thereby, the optical writing apparatus control part 120 can detects the patterns at the plural positions in the main scan direction, and accuracy in the position error correction operation can be improved as an average of the respective ones is calculated.

As shown in FIG. 8, the rows 401 of the position error correction patterns include start position correction patterns 411 and drum interval correction patterns 412. Further, as shown in FIG. 8, the drum interval correction patterns 412 are drawn repetitiously. The start position correction patterns 411 are patterns drawn for counting the writing start count value. Further, the start position correction patterns 411 are used by the sensor control part 123 to correct the detection timing of detecting the drum interval correction patterns 412.

The start position correction patterns 411 according to the embodiment are lines drawn by the photosensitive drum 109BK, and lines parallel to the main scan direction, as shown in FIG. 8. In start position correction by using the start position correction patterns 411, the optical writing apparatus control part 120 carries out a correction operation for the writing start timing based on reading signals from the start position correction patterns 411 provided by the pattern detection sensor 117. That is, the writing start timing reference value stored in the reference storage part 125 is a value of reference for a period of time from when the light source apparatus 281BK starts drawing of the black patterns of the start position correction patterns 411 by the photosensitive drum 109BK up to when the drawn black patterns are read by the pattern detection sensor 117 and the sensor control part 123 detects the patterns.

The drum interval correction patterns 412 are patterns drawn for counting the above-described drum interval count values. As shown in FIG. 8, the drum interval correction patterns 412 include sub-scan direction correction patterns 413 and main scan direction correction patterns 414. The optical writing apparatus control part 120 corrects respective position errors in the sub-scan direction of the photosensitive drums 109BK, 109M, 109C and 109Y based on reading signals from the sub-scan direction correction patterns 413 provided by the pattern detection sensor 117, and corrects respective position errors in the main scan direction of the respective photosensitive drums 109 based on reading signals from the main scan direction correction patterns 414 provided by the pattern detection sensor 117.

That is, the drum interval reference values stored in the reference value storage part 125 are values of reference for periods of time from when the light source apparatuses 281 start drawing of the drum interval correction patterns 412 under the control of the writing control part 121 up to when the respective lines included in the drawn drum interval correction patterns are read by the pattern detection sensor 117 and the sensor control part 123 detects the lines of the patterns. Thus, in the position error correction operation according to the embodiment, the writing control part 121, the count part 122, the sensor control part 123 and the correction value calculation part 124 cooperate together and function as a parameter correction part.

Figure 9:
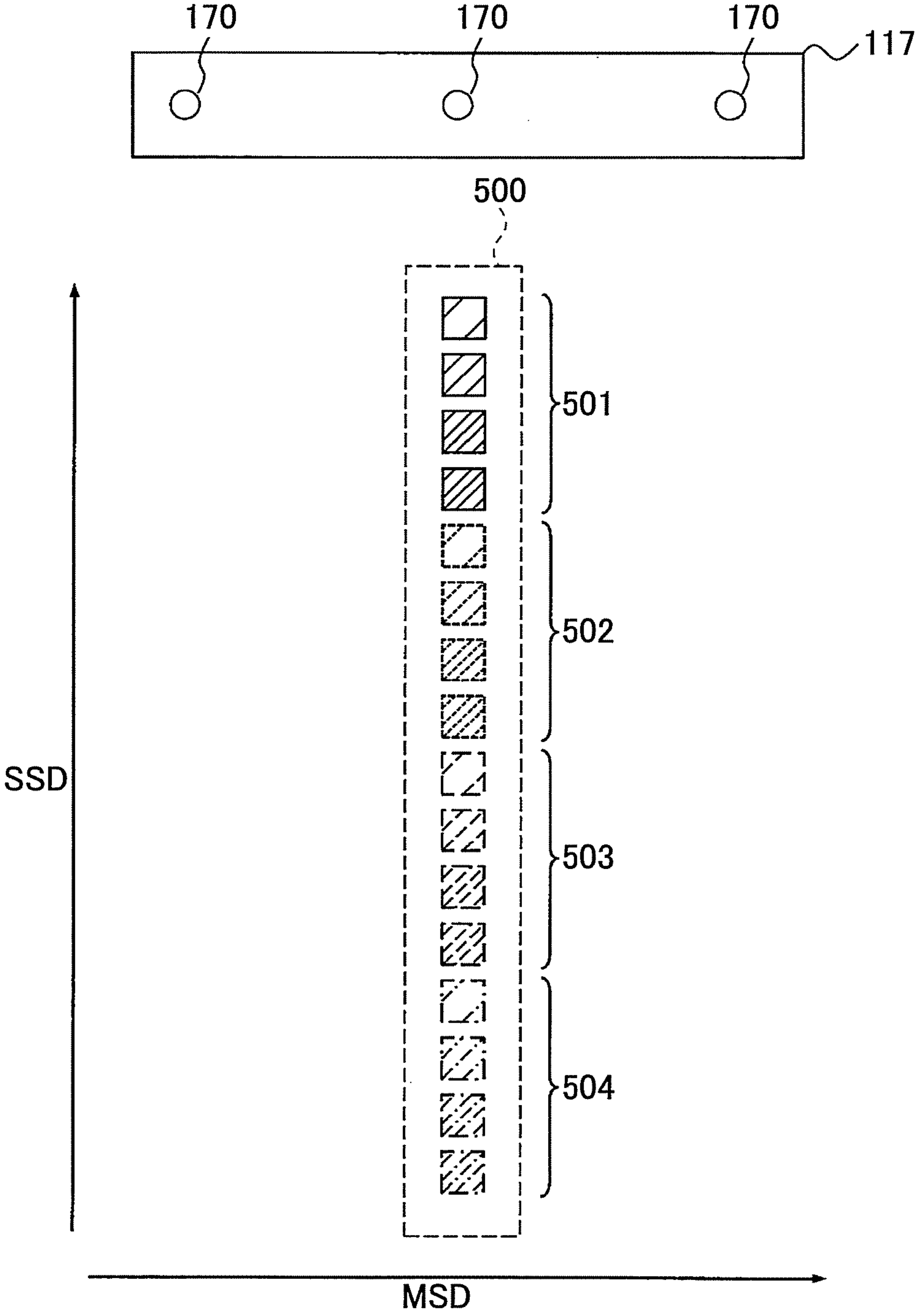
FIG. 9 shows an example of patterns drawn in a gradation correction operation according to the embodiment of the present invention.

Next, with reference to FIG. 9, the gradation correction operation according to the embodiment will now be described. FIG. 9 shows marks (hereinafter, referred to as gradation correction marks) drawn on the conveyance belt 105 by the light source apparatuses 281 that are controlled by the writing control part 121 in the gradation correction operation according to the embodiment. As shown in FIG. 9, the gradation correction marks 500 include black gradation patterns 501, yellow gradation patterns 502, magenta gradation patterns 503 and cyan gradation patterns 504.

The gradation patterns of each color included in the gradation correction patterns 500 include four square patterns having different densities, and the square patterns are arranged in the sub-scan direction in the order of the densities. Then, the gradation patterns of the respective colors are arranged in the sub-scan direction in the stated order of black, yellow, magenta and cyan. It is noted that as shown in FIG. 9, the gradation correction patterns 500 according to the embodiment are drawn at positions corresponding to the center sensor device of the three sensor devices 170 included in the pattern detection sensor 117. Further, in FIG. 9, the number of lines included in the hatching included in each square pattern represents the density of the respective one of the square patterns.

In the gradation correction using the gradation correction marks 500 shown in FIG. 9, the correction value calculation part 124 obtains from the sensor control part 123 information indicating densities based on reading signals from the gradation patterns of the respective colors provided by the pattern detection sensor 117, and carries out a correction operation for the bias voltages (development biases). That is, the density gradation reference values stored in the reference value storage part 125 are values of reference for the respective densities of the four square patterns having the different densities included in the gradation patterns of each color. Thus, in the gradation correction operation according to the embodiment, the writing control part 121, the sensor control part 123 and the correction value calculation part 124 cooperate and function as the parameter correction part.

In the image forming apparatus 1 and the drawing parameter correction operation according to the embodiment, determination as to which one is to be carried out from among drawing parameter correction only corresponding to a monochrome image forming mechanism, drawing parameter correction corresponding to a color image forming mechanism and drawing parameter correction corresponding to a full color image forming mechanism is optimized, and thus, reduction of the toner consumption amount and reduction of downtime of the image forming apparatus 1 are achieved. For this purpose, the optical writing apparatus control part 120 according to the embodiment, in addition to the drawing parameter correction operation for full color as described with reference to FIGS. 8 and 9, the drawing parameter correction operation only for monochrome images and the drawing parameter correction operation for color images are carried out. Then, when a correction operation for the drawing parameters is to be carried out, it is determined which of the above-mentioned three types of correction operations is to be carried out. Below, the correction operation for the drawing parameters according to the embodiment will be described.

Figure 10:
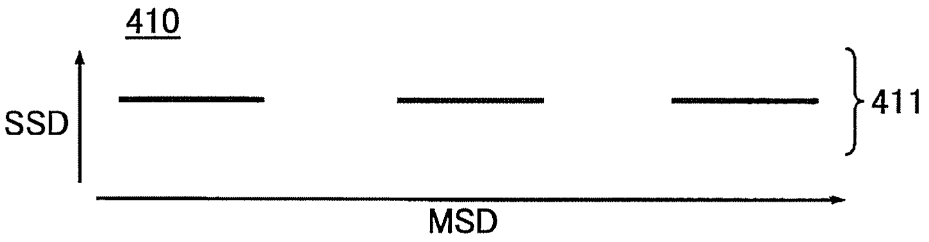
FIG. 10 shows an example of patterns drawn in a monochrome position error correction operation according to the embodiment of the present invention.
Figure 11:
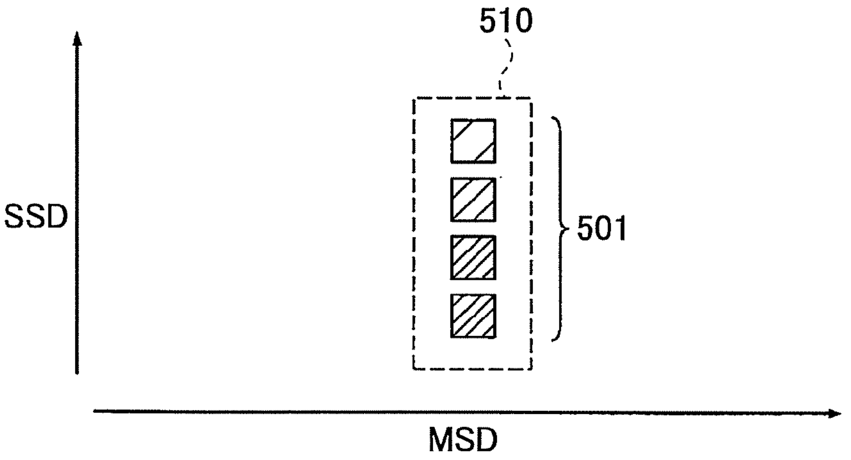
FIG. 11 shows an example of patterns drawn in a monochrome gradation correction operation according to the embodiment of the present invention.
Figure 12:
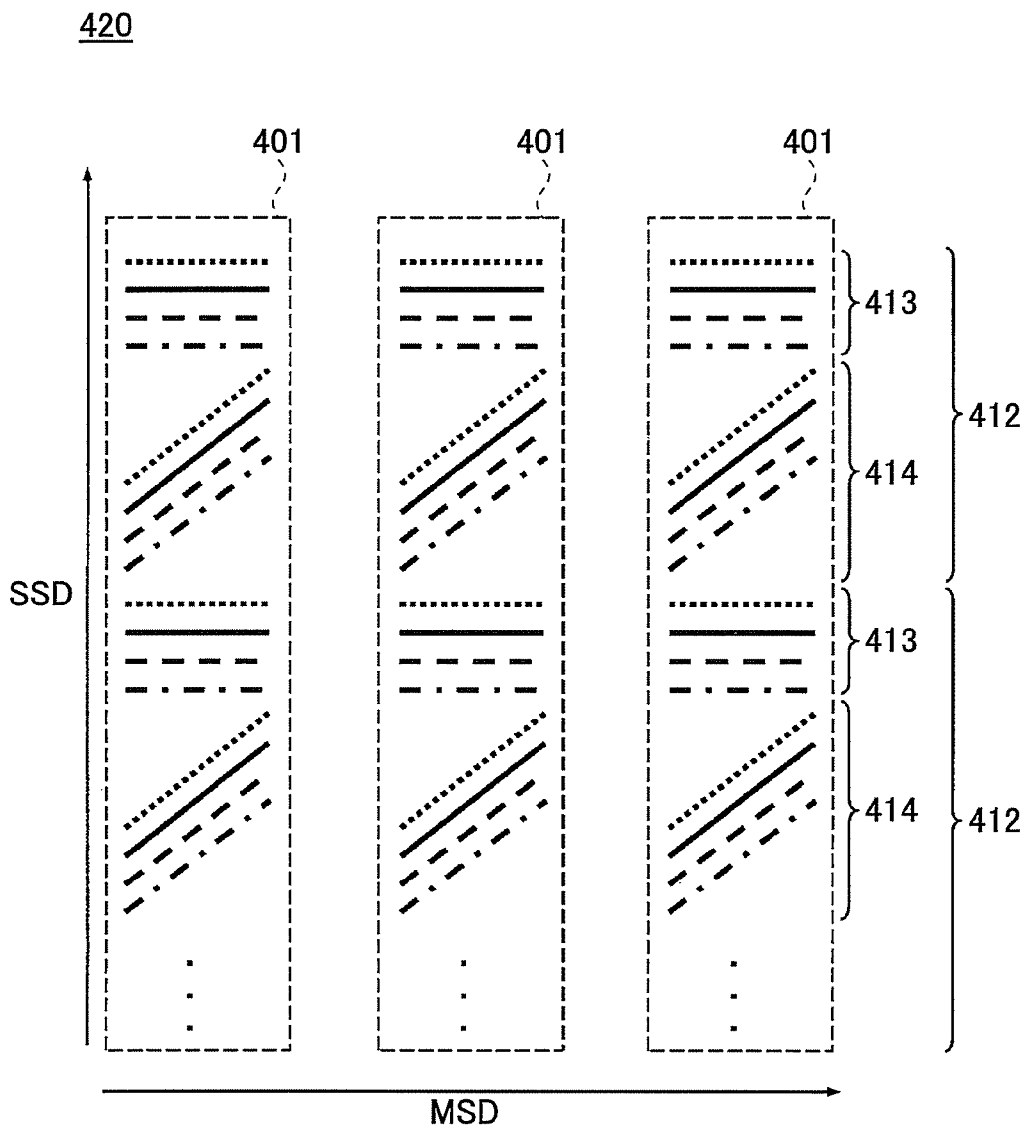
FIG. 12 shows an example of patterns drawn in a color position error correction operation according to the embodiment of the present invention.
Figure 13:
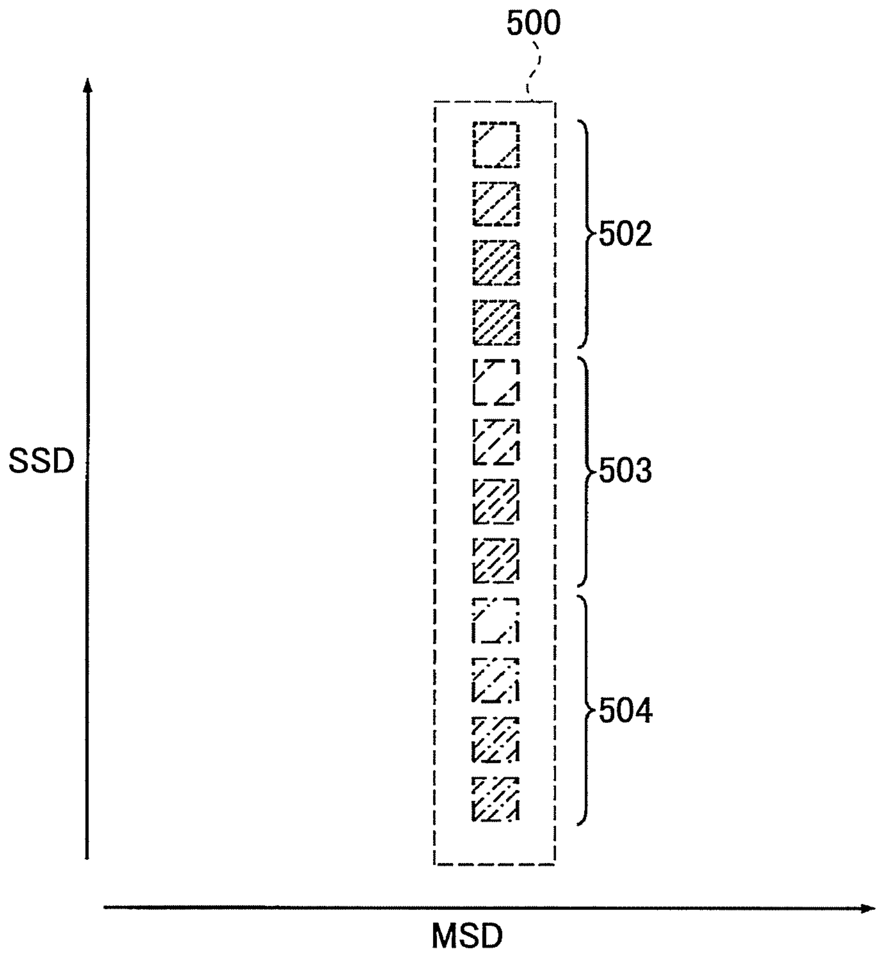
FIG. 13 shows an example of patterns drawn in a color gradation correction operation according to the embodiment of the present invention.

First, the drawing parameter correction only for monochrome images and the drawing parameter correction for color images will be described. FIG. 10 shows monochrome position error correction marks 410 drawn for the position error correction only for monochrome images. FIG. 11 shows monochrome gradation correction marks 510 drawn for the gradation correction only for monochrome images. FIG. 12 shows color position error correction marks 420 drawn for the position error correction for color images. FIG. 13 shows color gradation correction marks 520 drawn for the gradation correction for color images.

As shown in FIG. 10, the monochrome position error correction marks 410 only includes the start position correction patterns 411 from among the position error correction marks 400 described above with reference to FIG. 8. Thus, only the start position correction operation of the above-described position error correction operation is carried out in the position error correction only for monochrome images.

As shown in FIG. 11, the monochrome gradation correction marks 510 only includes the black gradation patterns 501 from among the gradation correction marks 500 described above with reference to FIG. 9. Thus, only adjustment of the bias voltage (i.e., the developing bias) to be applied to the photosensitive drum 109BK of the above-described gradation correction operation is carried out in the gradation correction only for monochrome images.

As shown in FIG. 12, the color position error correction marks 420 only includes the drum interval correction patterns 412 from among the position error correction marks 400 described above with reference to FIG. 8. Thus, only the drum interval correction operation of the above-described position error correction operation is carried out in the position error correction for color images of the colors other than black.

It is noted that as shown in FIG. 12, the drum interval correction patterns 412 include the patterns formed by the photosensitive drum 109BK. However, in the position error correction operation, the correction of the start position by using the start position correction patterns 411 such as those shown in FIG. 10 corresponds to monochrome correction, and the correction of only drum intervals regardless of the start position, as described with reference to FIG. 12, corresponds to color correction.

As shown in FIG. 13, the color gradation correction marks 520 only include the gradation patterns other than the black gradation patterns 501 from among the gradation correction marks 500 described above with reference to FIG. 9. Thus, only adjustment of the bias voltages (i.e., the developing biases) to be applied to the photosensitive drums other than the photosensitive drum 109BK of the above-described gradation correction operation is carried out in the gradation correction for color images of the colors other than black.

Thus, in the optical writing apparatus control part 120 according to the embodiment, it is possible to carry out, in a switching manner, one of the three types of correction operations respectively corresponding to the full color, monochrome and color, in the position error correction and the gradation correction. Next, the switching between the three types of correction operations will be described.

FIG. 14 shows information stored by the writing control part 121 for switching the above-mentioned three types of correction operations. The writing control part 121 according to the embodiment stores information of "output number of sheets count values" and "correction operation switching thresholds" as shown in FIG. 14.

Further, the "output number of sheets count values" includes, as shown in FIG. 14, respective count values of "after monochrome position error correction execution", "after color position error correction execution", "after monochrome gradation correction execution" and "after color gradation correction execution". The count value of "after monochrome position error correction execution" indicates the number of sheets that have been output (i.e., printed) in the image forming apparatus 1 since the correction by drawing the monochrome position error correction marks 410 shown in FIG. 10 was carried out last. Therefore, when the monochrome position error correction is carried out, the count value of "after monochrome position error correction execution" shown in FIG. 14 is reset.

The count value of "after color position error correction execution" indicates the number of sheets that have been output (i.e. printed) in the image forming apparatus 1 since the correction by drawing the color position error correction marks 420 shown in FIG. 12 was carried out last. Therefore, when the color position error correction is carried out, the count value of "after color position error correction execution" shown in FIG. 14 is reset. It is noted that when the correction is carried out by drawing the position error correction marks 400 shown in FIG. 8, it can be said that both the monochrome position error correction and the color position error correction are carried out, and thus, both the count values of "after monochrome position error correction execution" and "after color position error correction execution" shown in FIG. 14 are reset.

The count value of "after monochrome gradation correction execution" indicates the number of sheets that have been output (i.e. printed) in the image forming apparatus 1 since the correction by drawing the monochrome gradation correction marks 510 shown in FIG. 11 was carried out last. Therefore, when the monochrome gradation correction is carried out, the count value of "after monochrome gradation correction execution" shown in FIG. 14 is reset.

The count value of "after color gradation correction execution" indicates the number of sheets that have been output (i.e. printed) in the image forming apparatus 1 since the correction by drawing the color gradation correction marks 520 shown in FIG. 13 was carried out last. Therefore, when the color gradation correction is carried out, the count value of "after color gradation correction execution" shown in FIG. 14 is reset. It is noted that when the correction is carried out by drawing the gradation correction marks 500 shown in FIG. 9, it can be said that both the monochrome gradation correction and the color position gradation correction are carried out, and thus, both the count values of "after monochrome gradation correction execution" and "after color gradation correction execution" shown in FIG. 14 are reset.

The above-mentioned count values of "after monochrome position error correction execution" and "after monochrome gradation correction execution" are achromatic color progress information indicating a progress having occurred in the image forming apparatus 1 since the correction operation was carried out last for the mechanism of forming and outputting achromatic images, i.e., the photosensitive drum 109BK. Further, the above-mentioned count values of "after color position error correction execution" and "after color gradation correction execution" are chromatic color progress information indicating a progress having occurred in the image forming apparatus 1 since the correction operation was carried out last for the mechanism of forming and outputting chromatic images, i.e., the photosensitive drums 109M, 109C and 109Y. Thus, the writing control part 121 functions as a progress information storage part.

It is noted that as mentioned above, even in a case of chromatic color position error correction, i.e., in a case where the correction patterns of FIG. 12 are drawn and the correction is carried out, the patterns by the photosensitive drum 109BK are drawn. However, this operation is necessary to correct the parameter values of the drum intervals, and thus, the case where the correction patterns of FIG. 12 are drawn and the correction is carried out can be referred to as chromatic color position error correction because this case is not the case where only the photosensitive drum 109BK is directed to as the case of drawing the patterns shown in FIG. 10. Further, because the start position correction patterns 411 that are directed only to the photosensitive drum 109BK are not included in the correction patterns of FIG. 12, the case where the correction patterns of FIG. 12 are drawn and the correction is carried out is not to be referred to as full color position error correction but to be referred to as color position error correction.

The “correction operation switching thresholds” shown in FIG. 14 includes “position error correction execution necessary threshold”, “position error correction execution unnecessary threshold”, “gradation correction execution necessary threshold” and “gradation correction execution unnecessary threshold”. The “position error correction execution necessary threshold” and the “position error correction execution unnecessary threshold” are thresholds for the count values of “after monochrome position error correction execution” and “after color position error correction execution”, and are thresholds for determining that execution of the position error correction is necessary and for determining that execution of the position error correction is unnecessary, respectively.

On the other hand, the “gradation correction execution necessary threshold” and the “gradation correction execution unnecessary threshold” are thresholds for the count values of “after monochrome gradation execution” and “after color gradation correction execution”, and are thresholds for determining that execution of the gradation correction is necessary and for determining that execution of the gradation correction is unnecessary, respectively. Thus, the writing control part 121 functions as a threshold storage part.

According to the embodiment, the “position error correction execution necessary threshold” is “120 sheets”, and the “position error correction execution unnecessary threshold” is “100 sheets”. Further, the “gradation correction execution necessary threshold” is “200 sheets”, and the “gradation correction execution unnecessary threshold” is “180 sheets”. That is, differences exist between the respective correction execution necessary thresholds and correction execution unnecessary thresholds. Determinations are made when the above-mentioned count values are between the correction execution necessary thresholds and correction execution unnecessary thresholds as described below.

FIG. 15 shows determinations made in cases where the above-mentioned count values are between the correction execution necessary threshold and correction execution unnecessary threshold. In FIG. 15, the count values of “after monochrome gradation correction execution” and “after color gradation correction execution” are arranged in a form of a matrix based on the above-mentioned “gradation correction execution necessary threshold” and “gradation correction execution unnecessary threshold”, and determination results for the respective count values are described in respective cells.

For example, in a case where each of both the count values of “after monochrome gradation correction execution” and “after color gradation correction execution” is equal to or more than 200 sheets, the count value becomes equal to or more than the thresholds for the gradation correction being necessary for both monochrome and color, and thus, full color gradation correction is carried out (cell (a) of FIG. 15).

On the other hand, in a case where the count value of “after monochrome gradation correction execution” is equal to or more than 200 sheets and the count value of “after color gradation correction execution” is less than 180 sheets, the monochrome gradation correction is necessary but the color gradation correction is unnecessary, and thus, the monochrome gradation correction is carried out (cell (c) of FIG. 15).

In a case where the count value of “after monochrome gradation correction execution” is less than 180 sheets and the count value of “after color gradation correction execution” is equal to or more than 200 sheets, the monochrome gradation correction is unnecessary but the color gradation correction is necessary, and thus, the color gradation correction is carried out (cell (g) of FIG. 15).

In a case where each of both the count values of “after monochrome gradation correction execution” and “after color gradation correction execution” is less than 180 sheets, none of the monochrome gradation correction and the color gradation correction is necessary, and thus, no correction (i.e., no adjustment) is carried out (cell (i) of FIG. 15).

Here, a case where the count value of “after monochrome gradation correction execution” is equal to or more than 180 sheets and less than 200 sheets will be described. In this case, because the count value has not become equal to or more than the above-mentioned gradation correction execution necessary threshold, and thus, in principle, the monochrome gradation correction is not carried out. As shown in FIG. 15, cells (e) and (f), when the count value of “after color gradation correction execution” is less than 200 sheets, also execution of the color gradation correction is not determined to be necessary, and thus, no correction (i.e., no adjustment) is carried out the same as the above-mentioned cell (i). On the other hand, when the count value of “after color gradation correction execution” is equal to or more than 200 sheets, at least the color gradation correction is carried out. At this time, if only the color gradation correction were carried out, the count value of “after monochrome gradation correction execution” would become equal to or more than the 200 sheets in a case where, after that, for example, a job of forming and outputting on the order of 20 sheets will be input and then a job of forming and outputting a monochrome image or images will be input within a short span of time. In this case, as a result, the monochrome gradation correction would be carried out within the short span of time after the color gradation correction would be carried out.

According to the embodiment, as shown in FIGS. 11 and 13, the monochrome gradation correction and the color gradation correction can be carried out separately. Therefore, even if the monochrome gradation correction and the color gradation correction would be thus carried out within a short span of time, useless toner consumption does not occur. However, a total time of the case where the monochrome gradation correction and the color gradation correction would be separately carried out would become longer than a case where the full color gradation correction is carried out once by drawing the gradation correction marks 500 shown in FIG. 9, because of overhead or such required when starting the correction (i.e., adjustment) operations. As a result, downtime in the image forming apparatus 1 would be increased.

In order to avoid such adverse effect, according to the embodiment, in a case where the count value "after monochrome gradation correction execution" is equal to or more than 180 sheets and less than 200 sheets, that is, in a case where the count value is between the correction execution unnecessary threshold and the correction execution necessary threshold (hereinafter, referred to as a correction execution necessary/unnecessary undetermined range), and also, the count value "after color gradation correction execution" is equal to or more than 200 sheets, that is, equal to or more than the correction execution necessary threshold, it is determined that it is immediately before also execution of the monochrome gradation correction will become necessary. Therefore, in this case, the full color gradation correction is carried out which includes not only the gradation correction only for color but also the monochrome gradation correction (see cell (d) of FIG. 15).

In other words, according to the embodiment, in a case where the count value of "after color gradation correction execution" is equal to or more than 200 sheets, the color gradation correction is carried out in principle. However, in a case where further the count value "after monochrome gradation correction execution" is equal to or more than 180 sheets and less than 200 sheets (see cell (d) of FIG. 15), the full color gradation correction is carried out instead of the color gradation correction. Thereby, it is possible to avoid a case where the monochrome gradation correction would be carried out within a short span of time after the color gradation correction would be carried out and thus downtime of the image forming apparatus 1 would be increased.

Similarly, in a case where the count value of "after color gradation correction execution" is in the correction execution necessary/unnecessary undetermined range, the color gradation correction is not carried out in principle (cells (e), (h) of FIG. 15). However, in a case where further the count value "after monochrome gradation correction execution" becomes equal to or more than the correction execution necessary threshold and thus it is determined that execution of the monochrome gradation correction is necessary, not only the monochrome gradation correction but the full color gradation correction is carried out, because a likelihood that the color gradation correction would be carried out within a short span of time after that is high (cell (b) of FIG. 15).

FIG. 16 shows determinations as to whether the position error correction is necessary, the same as FIG. 15 that shows the determinations as to whether the gradation correction is necessary. In FIG. 16, the count values of "after monochrome position error correction execution" and "after color position error correction execution" are arranged in a form of a matrix based on the above-mentioned "position error correction execution necessary threshold" and "position error correction execution unnecessary threshold", and determination results for the respective count values are described in respective cells.

As shown in FIG. 16, the same as the case of the gradation correction of FIG. 15, in a case where each of both the count values of "after monochrome position error correction execution" and "after color position error correction execution" is equal to or more than 120 sheets ("position error correction execution necessary threshold"), the count value becomes equal to or more than the thresholds for the position error correction being necessary for both monochrome and color, and thus, full color position error correction is carried out (cell (a) of FIG. 16).

In a case where the count value of "after monochrome position error correction execution" is equal to or more than 120 sheets ("position error correction execution necessary threshold") and the count value of "after color position error correction execution" is less than 100 ("position error correction execution unnecessary threshold") sheets, the monochrome position error correction is necessary but the color position error correction is unnecessary, and thus, the monochrome position error correction is carried out (cell (c) of FIG. 16).

In a case where the count value of "after monochrome position error correction execution" is less than 100 sheets ("position error correction execution unnecessary threshold") and the count value of "after color position error correction execution" is equal to or more than 120 sheets ("position error correction execution necessary threshold"), the monochrome position error correction is unnecessary but the color position error correction is necessary, and thus, the color position error correction is carried out (cell (g) of FIG. 16).

In a case where each of both the count values of "after monochrome position error correction execution" and "after color position error correction execution" is less than 100 sheets ("position error correction execution unnecessary threshold"), none of the monochrome position error correction and the color position error correction is necessary, and thus, no correction (i.e., no adjustment) is carried out (cell (i) of FIG. 16). It is noted that in the case of position error correction, the monochrome position error correction is the start position correction and the color position error correction is the drum interval correction as mentioned above.

Further, for example, when the count value of "after color position error correction execution" is equal to or more than the "position error correction execution necessary threshold" (i.e., 120 sheets) and the count value of "after monochrome position error correction execution" is in the "correction execution necessary/unnecessary undetermined range" (i.e., equal to or more than 100 sheets and less than 120 sheet), the full color position error correction that includes not only the position error correction only for color, i.e., the drum interval correction, but also the monochrome position error correction, i.e., the start position correction, is carried out (cell (d) of FIG. 16).

Similarly, when the count value of "after monochrome position error correction execution" is equal to or more than the "position error correction execution necessary threshold" (i.e., 120 sheets) and the count value of "after color position error correction execution" is in the "correction execution necessary/unnecessary undetermined range" (i.e., equal to or more than 100 sheets and less than 120 sheets), the full color position error correction that includes not only the position error correction only for monochrome, i.e., the start position correction, but also the position error correction for color, i.e., the drum interval correction, is carried out (cell (b) of FIG. 16). By the process, the same as the above-mentioned case of the gradation correction, it is possible to avoid a case where the color position error correction and the monochrome position error correction would be carried out separately within a short span of time and downtime of the image forming apparatus 1 would be increased.

Figure 17:
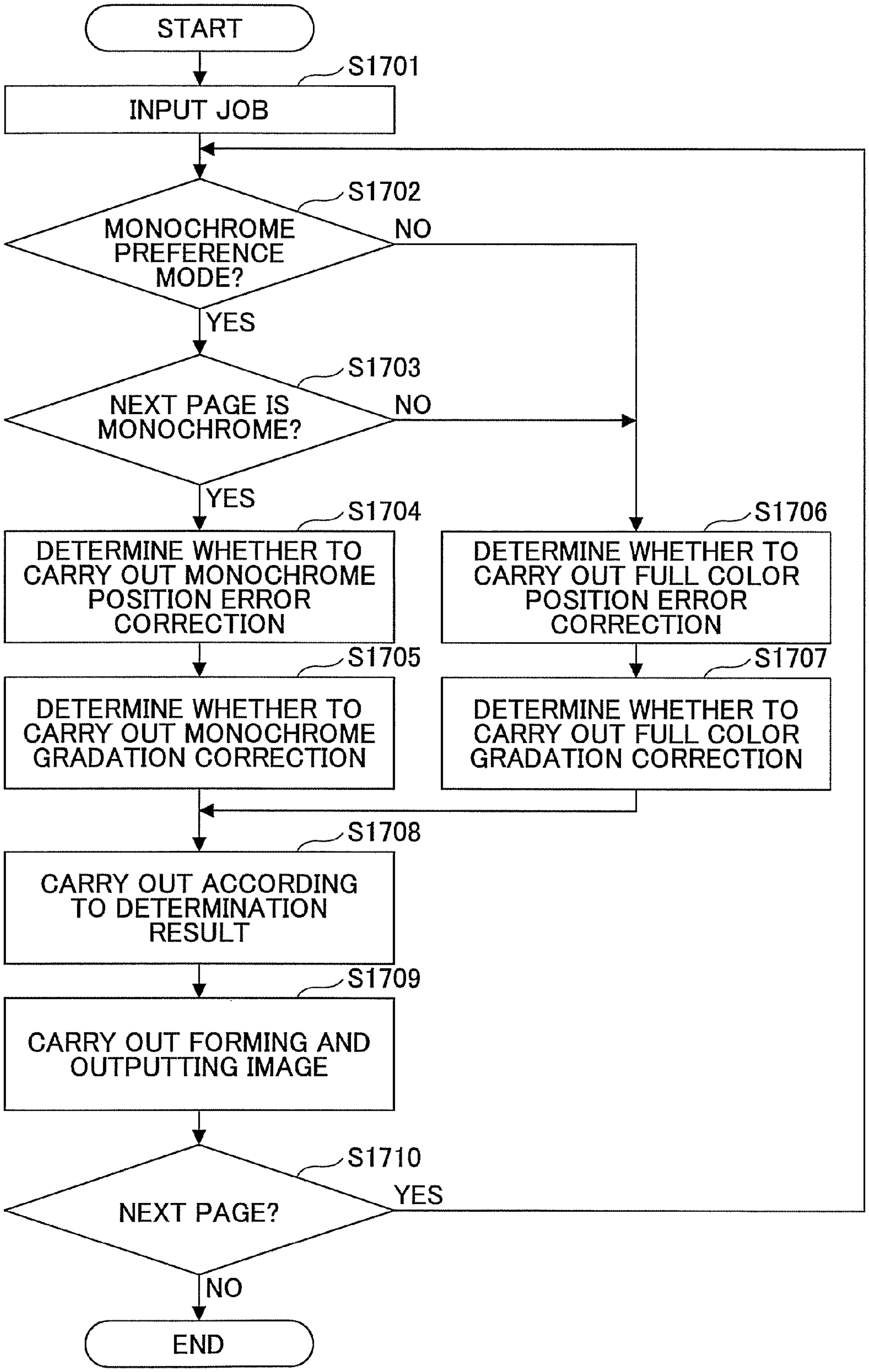
FIG. 17 is a flowchart showing an operation for a case where a job is input in the image forming apparatus according to the embodiment of the present invention.

It is noted that the above-mentioned determination as to whether the correction execution is necessary is carried out by the writing control part 121. Below, the determination as to whether the correction execution is necessary according to the embodiment will be described with reference to FIG. 17. FIG. 17 is a flowchart showing an operation of the determination as to whether the correction execution is necessary carried out by the writing control part 121 in a case where a job of forming and outputting an image or images is input in the image forming apparatus 1 according to the embodiment.

As shown in FIG. 17, when the job is input to the image forming apparatus 1 (step S1701) and a drawing command is input to the optical writing apparatus control part 120 of the print engine 26 through the engine control part 31, the writing control part 121 determines whether an operation mode of the image forming apparatus 1 is a monochrome preference mode (step S1702). The monochrome preference mode is an achromatic color preference operation mode in which even if a full color image is given, the given image is output as a monochrome image, as long as no clear instruction for full color output is given. This operation mode is set in the controller 20 of the image forming apparatus 1, and the writing control part 121 determines the operation mode through the engine control part 31.

In a case where the operation mode is the monochrome preference mode (step S1702 YES), the writing control part 121 determines whether a page to be output (i.e., printed) is of color or monochrome (step S1703). This determination is not determination as to whether the original image is of color or monochrome but determination as to whether a clear instruction for color output is given although the operation mode is the monochrome preference mode. That is, it is determined whether drawing information input through a page memory is of color or monochrome.

In a case where the result of the determination of step S1703 is monochrome output (step S1703 YES), the writing control part 121 carries out determination as to whether the monochrome position error correction is necessary (step S1704) and determination as to whether the monochrome gradation correction is necessary (step S1705). In the determinations of steps S1704 and S1705, the writing control part 121 reads the respective ones of the count values "after monochrome position error correction execution" and "after monochrome gradation correction execution", compares them with the "position error correction execution necessary threshold" and "gradation correction execution necessary threshold", respectively, and determines whether the monochrome position error correction and the monochrome gradation correction are necessary.

On the other hand, in a case where the result of the determination of step S1702 is not the monochrome preference mode (step S1702 NO) or in a case where the result of the determination of step S1703 is that the next page to be output is not of monochrome (step S1703 NO), the writing control part 121 carries out determination as to whether the full color position error correction is necessary (step S1706) and determination as to whether the full color gradation correction is necessary (step S1707). The determinations of steps S1706 and S1707 are the determinations described above with reference to FIGS. 15 and 16, and will be described later in detail with reference to FIG. 18.

As described above, in the image forming apparatus 1 according to the embodiment, it is determined whether the correction is necessary based on the comparison of the output number of sheets count value that is the information of the progress after the correction was carried out last with the correction execution necessary threshold for each of color and monochrome in principle. Further, it is determined that the correction is unnecessary based on the comparison with the correction execution unnecessary threshold.

However, in a case where it is determined that the correction is necessary because the output number of sheets count value becomes equal to or more than the correction execution necessary threshold for one of color and monochrome, it is expected that, also for the other of color and monochrome, the correction execution necessary threshold will be reached shortly even though the output number of sheets count value has not become equal to or more than the correction execution necessary threshold yet but the output number of sheets count value has become equal to or more than the correction execution unnecessary threshold. In this case, in order to avoid a case where the color position error correction and the monochrome position error correction would be carried out separately within a short span of time, not only the correction for the one of color and monochrome for which it has been determined that execution is necessary, but the correction for full color is carried out, according to the embodiment.

On this condition, the significance of the determinations of steps S1702 and S1703 will now be described. The determinations of steps S1702 and S1703 are carried out in consideration that in the case of the monochrome preference mode, it is considered that a frequency of occurrences of forming and outputting full color images is low. Therefore, in this case, even when the count value after the execution of the correction for color has become equal to or more than the correction execution unnecessary threshold as mentioned above, a period of time taken for the count value after the execution of the correction for color reaching the correction execution necessary threshold is not necessarily short. Therefore, steps S1702 and S1703 are carried out.

That is, when the operation mode is the monochrome preference mode in step S1702, the operation flow is switched to the side on which the steps S1704 and S1705 are to be carried out. However, when the next page is of color output, the count value of the number of sheets for color will be increased although the operation mode is the monochrome mode, and therefore, in this case, the operation flow is then returned to the side on which the steps S1706 and S1707 are to be carried out. Thereby, it is possible to avoid a case where even when the operation mode is the monochrome preference mode, the frequency of the correction operations for color would be increased meaninglessly because of applying the embodiment.

When the operation of step S1705 or S1707 is completed, the writing control part 121 carries out the correction operation according to the corresponding determination result (step S1708), and subsequently, carries out forming and outputting an image, i.e., drives the light source apparatus(es) 281, forms electrostatic latent image(s) and carries out development and transfer (step S1709). After the completion of forming and outputting the image, the writing control part 121 determines whether there is a next page to output (step S1710). Then, when there is a next page (step S1710 YES), the process starting from step S1702 is repeated. When there is no next page (steps S1710 NO), the process is finished. Thus, in the image forming apparatus 1 according to the embodiment, the operation carried out when the job to form and output an image or images is input is completed.

Figure 18:
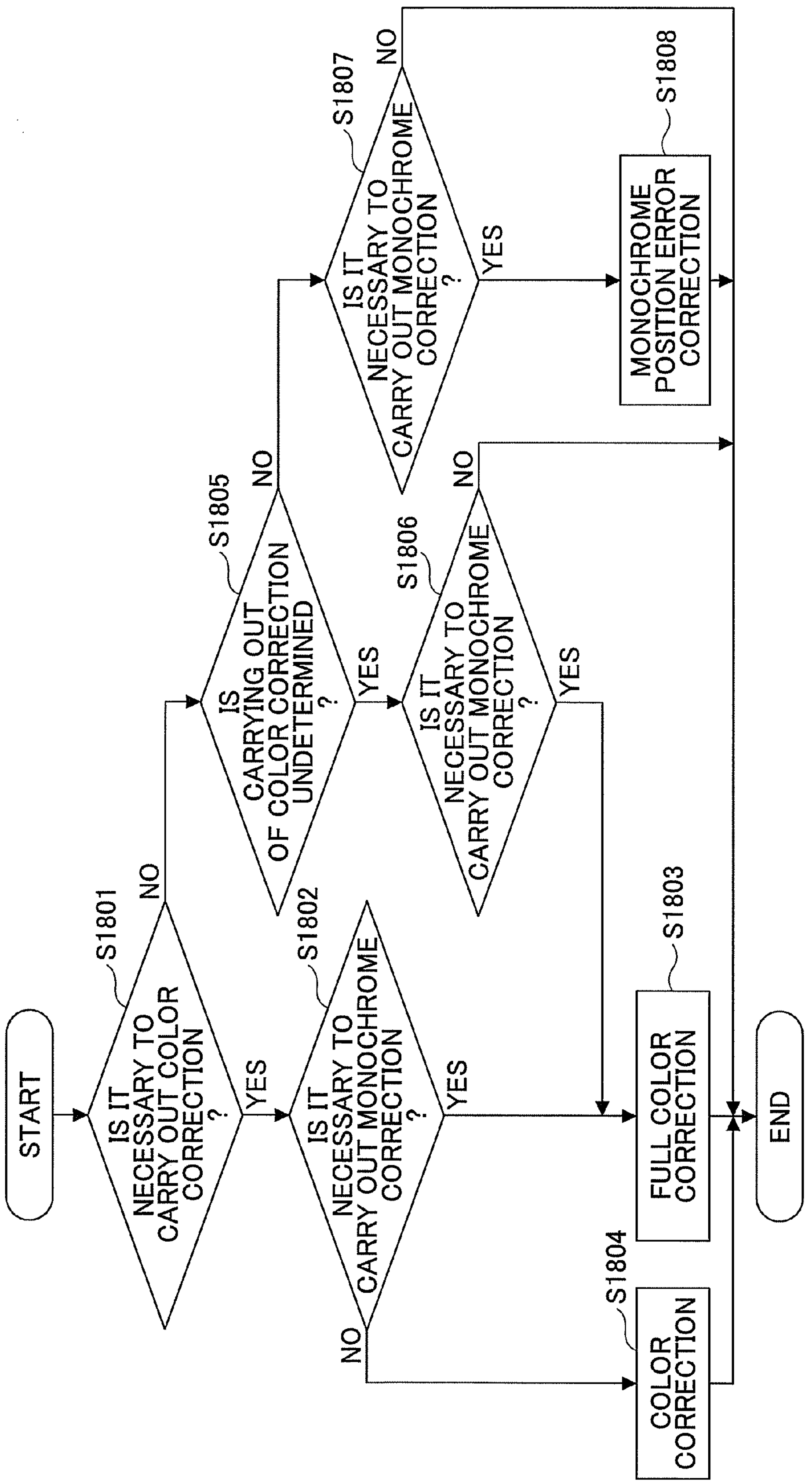
FIG. 18 is a flowchart showing an operation of determining whether it is necessary to carry out a correction operation according to the embodiment of the present invention.

Next, with reference to FIG. 18, details of the determinations as to whether the full color correction is necessary, i.e., the processes of steps S1706 and S1707 of FIG. 17, will be described. FIG. 18 is a flowchart showing the details of determinations as to whether the correction (i.e., adjustment) is necessary, carried out by the writing control part 121. In FIG. 18, the determinations concerning the gradation correction will be described as one example. The process of the determinations concerning the position error correction are the same as the process of the determinations concerning the gradation correction merely except that the count values and the thresholds to read are different, and duplicate description will be omitted.

As shown in FIG. 18, the writing control part 121 first determines whether execution of the color gradation correction is necessary (step S1801). That is, by comparing the count value of "after color gradation correction execution" described above with reference to FIG. 14 with the "gradation correction execution necessary threshold", the writing control part 121 determines whether execution of the color gradation correction is necessary.

In a case where the count value after the color gradation correction execution is equal to or more than the gradation correction execution necessary threshold (step S1801 YES), the writing control part 121 then determines whether execution of the monochrome gradation correction is necessary (step S1802). That is, by comparing the count value of "after monochrome gradation correction execution" with the "gradation correction execution unnecessary threshold", the writing control part 121 determines whether execution of the monochrome gradation correction is necessary.

As described above with reference to FIGS. 15 and 16, in the case where execution of the correction for color is necessary, execution of the correction for monochrome is determined to be necessary when the count value of "after monochrome gradation correction execution" becomes equal to or more than, not the execution necessary threshold but the execution unnecessary threshold. Therefore, in the determination of step S1802, the writing control part 121 compares with the "gradation correction execution unnecessary threshold".

In a case where it is determined in step S1802 that the count value after the monochrome gradation correction execution is equal to or more than the gradation correction execution unnecessary threshold (step S1802 YES), the writing control part 121 determines that the full color gradation correction, i.e., the correction operation to be carried out by drawing the patterns of FIG. 9, is necessary (step S1803).

On the other hand, in a case where it is determined in step S1802 that the count value after the monochrome gradation correction execution is less than the gradation correction execution unnecessary threshold (step S1802 NO), the writing control part 121 determines that the color gradation correction, i.e., the correction operation to be carried out by drawing the patterns of FIG. 13, is necessary (step S1804).

In a case where the count value after the color gradation correction execution is less than the gradation correction execution necessary threshold (step S1801 NO), the writing control part 121 then determines whether execution of the color gradation correction is undetermined (step S1805). In step S1805, by comparing the count value of "after color gradation correction execution" with the "gradation correction execution unnecessary threshold" described above with reference to FIG. 14, the writing control part 121 determines whether execution of the color gradation correction is undetermined.

In a case where the count value after the color gradation correction execution is equal to or more than the gradation correction execution unnecessary threshold (step S1805 YES), the writing control part 121 then determines whether execution of the monochrome gradation correction is necessary (step S1806). That is, in step S1806, by comparing the count value of "after monochrome gradation correction execution" with the "gradation correction execution necessary threshold", the writing control part 121 determines whether execution of the monochrome gradation correction is necessary.

It is noted that in a case where execution of the correction for color is undetermined and execution of the correction for monochrome is necessary, not only the correction for monochrome but the correction for full color is carried out as described above with reference to FIGS. 15 and 16. Therefore, in the determination of step S1806, the writing control part 121 compares with the "gradation correction execution necessary threshold".

In a case where it is determined in step S1806 that the count value after the monochrome gradation correction execution is equal to or more than the gradation correction execution necessary threshold (step S1806 YES), the writing control part 121 determines that the full color gradation correction, i.e., the correction operation to be carried out by drawing the patterns of FIG. 9, is necessary (step S1803).

On the other hand, in a case where it is determined in step S1806 that the count value after the monochrome gradation correction execution is less than the gradation correction execution necessary threshold (step S1806 NO), the writing control part 121 determines that none of the correction for monochrome and the correction for color is necessary, and finishes the process.

In a case where it is determined in step S1805 that the count value after the color gradation correction execution is less than the gradation correction execution unnecessary threshold (step S1805 NO), i.e., in a case where the color gradation correction is not necessary, the writing control part 121 then determines whether execution of the monochrome gradation correction is necessary (step S1807). In step S1807, by comparing the count value of "after monochrome gradation correction execution" with the "gradation correction execution necessary threshold" described above with reference to FIG. 14, the writing control part 121 determines whether execution of the monochrome gradation correction is necessary.

It is noted that in a case where the color gradation correction is not necessary, the monochrome gradation correction becomes necessary only in a case where the count value after the monochrome gradation correction execution becomes equal to or more than the gradation correction execution necessary threshold. Therefore, the process of step 1807 is the same as the determinations of steps S1704 and S1705 of FIG. 17.

In a case where it is determined in step S1807 that the count value after the monochrome gradation correction execution is equal to or more than the gradation correction execution necessary threshold (step S1807 YES), the writing control part 121 determines that the monochrome gradation correction is necessary (step S1808), and finishes the process. On the other hand, in a case where it is determined in step S1807 that the count value after the monochrome gradation correction execution is less than the gradation correction execution necessary threshold (step S1807 NO), the writing control part 121 determines that none of the monochrome gradation correction and the color gradation correction is necessary, and finishes the process. Thus, the determination as to whether the correction is necessary according to the embodiment is completed.

Thus, according to the embodiment, for each of color and monochrome, based on the comparison between the output number of sheets count value that is the information of the progress having occurred since the correction was carried out last and the correction execution necessary threshold, it is determined that the correction is necessary. In a case where the output number of sheets count value becomes equal to or more than the correction execution necessary threshold and thus it is determined that the correction is necessary for one of color and monochrome, not only the correction for the one of color and monochrome thus determined necessary but the correction for full color is carried out when the output number of sheets count value is equal to or more than the correction execution unnecessary threshold for the other of color and monochrome. This is because even when the output number of sheets count value has not yet become equal to or more than the correction execution necessary threshold for the other of color and monochrome, it is expected that shortly the output number of sheets count value will reach the correction execution necessary threshold also for the other of color and monochrome. Thereby, in the optical writing apparatus included in the image forming apparatus 1, it is possible to prevent that the correction operations of color and monochrome would be separately carried out within a short span of time, and to reduce consumption of developer and downtime of the image forming apparatus 1 occurring because of the correction (i.e., adjustment) operation of the optical writing apparatus.

It is noted that when the correction operation is carried out in step S1708 of FIG. 17, the sensor control part 123 adjusts the amounts of light of the light emission devices included in the pattern detection sensor 117 as mentioned above. Also this adjustment operation is not carried out each time when the correction operation is carried out, and it is determined whether to carry out the adjustment operation based on the conditions of the image forming apparatus 1. This determination will now be described with reference to FIG. 19.

Figure 19:
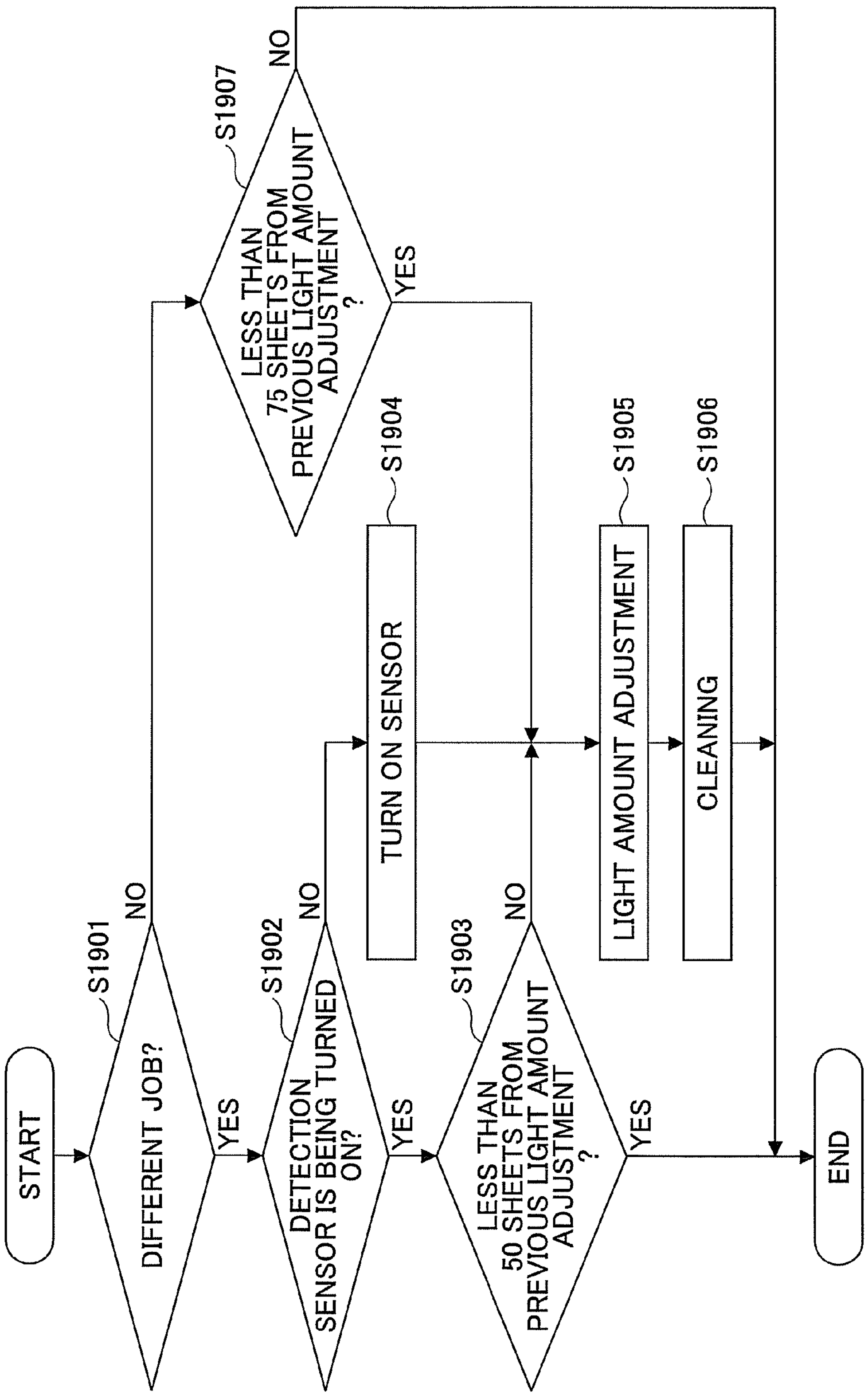
FIG. 19 is a flowchart showing an operation of determining whether it is necessary to carry out an operation of adjustment of amounts of light of a sensor control part according to the embodiment of the present invention.

FIG. 19 is a flowchart showing the operation of determining whether to carry out the adjustment of the amounts of light of the light emission devices included in the pattern detection sensor 117. As shown in FIG. 19, when the correction operation is carried out, the sensor control part 123 first determines whether the job of forming and outputting an image or images which is currently being processed is included in a series of jobs, i.e., the same job as the job of forming and outputting an image or images in which the adjustment of the amounts of light was carried out previously (step S1901).

The significance of step S1901 is that when the job the same as the job of forming and outputting an image or images in which the adjustment of the amounts of light was previously carried out is being currently processed, it can be expected that not so long period of time has elapsed since the adjustment of the amounts of light was carried out previously. Therefore, basically, it is determined that the adjustment of the amounts of light is not necessary.

In a case where it is determined in step S1901 that the job currently being processed is different from the job in which the adjustment of the amounts of light was carried out previously (step S1901 YES), the sensor control part 123 determines whether the pattern detection sensor 117 is emitting light (step S1902). It is noted that the sensor control part 13 continues to emit light for a predetermined period time after one printing job is finished, in order to avoid a useless process that the pattern detection sensor 117 would be caused to stop emitting light, then, within a short span of time, a printing job will be input and thus, the pattern detection sensor 117 would be caused to start emitting light again. The significance of step S1902 is that when the pattern detection sensor 117 is emitting light, basically it is determined that the adjustment of the amounts of light is not necessary.

When it is determined in step S1902 that the pattern detection sensor 117 is emitting light (step S1902 YES), the adjustment of the amounts of light is not necessary in principle as mentioned above. However, the correction of the parameter values becomes necessary because of a change in the conditions of the image forming apparatus 1 such as the print engine 26 having been heated up, in a case where many pages have been output (i.e., printed) within a short period of time, such as a case where a job including many pages has been executed. Therefore, the sensor control part 123 determines, as a progress having occurred from the previous adjustment of the amounts of light, whether the number of sheets having been output is equal to or more than 50 (step S1903).

When it is determined in step S1903 that the number of sheets having been output since the previous adjustment of the amounts of light is less than 50 (step S1903 YES), the sensor control part 123 determines that the adjustment of the amounts of light is not necessary and finishes the process. On the other hand, when it is determined in step S1903 that the number of sheets having been output since the previous adjustment of the amounts of light is equal to or more than 50 (step S1903 NO), the sensor control part 123 carries out the adjustment of the amounts of light (step S1905), waits for toner adhering to the conveyance belt 105 because of the adjustment of the amounts of light being cleaned (step S1906), and finishes the process. It is noted that step S1906 is carried out in a case where a toner mark or such formed on the conveyance belt 105 is used in the adjustment of the amounts of light of the light emission devices as mentioned above.

In a case where it is determined in step S1902 that emitting of light in the toner detection sensor 117 has been stopped (step S1902 NO), the sensor control part 123 causes the toner detection sensor 117 to start emitting light (step S1904), then carries out the adjustment of the amounts of light (step S1905) and finishes the process after the cleaning is finished (step S1906)

When it is determined in step S1901 that the job that is currently being processed is the same as the job in which the adjustment of the amounts of light was carried out previously (step S1901 NO), the adjustment of the amounts of light is not necessary in principle as mentioned above. However, the correction of the parameter values becomes necessary because of a change in the conditions of the image forming apparatus 1 such as the print engine 26 having been heated up, in a case where the job that is currently being processed includes many pages and thus, the many pages have been output (i.e., printed) within a short period of time. Therefore, the sensor control part 123 determines, as a progress having occurred from the previous adjustment of the amounts of light, whether the number of sheets having been output is equal to or more than 75 (step S1907).

When it is determined in step S1907 that the number of sheets having been output since the previous adjustment of the amounts of light is less than 75 (step S1907 NO), the sensor control part 123 determines that the adjustment of the amounts of light is not necessary and finishes the process. On the other hand, when it is determined in step S1907 that the number of sheets having been output since the previous adjustment of the amounts of light is equal to or more than 75 (step S1907 YES), the sensor control part 123 carries out the adjustment of the amounts of light (step S1905), waits for toner adhering to the conveyance belt 105 because of the adjustment of the amounts of light being cleaned (step S1906) and finishes the process.

Thus, it is possible to avoid waste also concerning the number of times of carrying out the adjustment of the amounts of light, and to reduce downtime of the image forming apparatus 1. It is noted that the number of sheets for the determination is different between steps S1903 and S1907. This is because in the case of the same job, i.e., in the case of step 1907, outputting (i.e., printing) of respective pages is carried out successively. In contrast thereto, in the case of the different job, i.e., in the case of step S1903, it is expected that a time lag occurs from the previous job being finished up to the current job being input. As a result, in this case, it is expected that a relatively long time has elapsed since the previous adjustment of the amounts of light. Therefore, the threshold of the number of sheets (i.e., 50 sheets) for determining that again adjusting the amounts of light is necessary is made smaller in step S1903 than the threshold in step S1907 (i.e., 75 sheets).

It is noted that as shown in FIGS. 15 and 16, the thresholds for determining whether the gradation correction is necessary are different from the thresholds for determining whether the position error correction is necessary. This is because it is necessary to carry out the determination as to whether the position error correction is necessary within a relatively short span of time because of distortion of the reflection mirror 280 caused by heating, expansion or contradiction of the conveyance belt 105 and so forth. Therefore, in the above-mentioned embodiment, the thresholds are made different between the determination as to whether the position error correction is necessary and the determination as to whether the gradation correction is necessary. Other than this configuration, for example, such a configuration may be provided that in a case where it has been determined that the correction is necessary in the determination as to whether the gradation correction is necessary, also the position error correction is carried out unconditionally in addition to the gradation correction.

In this case, instead of the stated order of the determination as to whether the position error correction is necessary (steps S1704, S1706) and the determination as to whether the gradation correction is necessary (steps S1705, S1707) as shown in FIG. 17, the determination as to whether the gradation correction is necessary is carried out first. Thereby, it is possible to omit the determination as to whether the position error correction is necessary in a case where it has been determined that the correction operation is necessary in the determination as to whether the gradation correction is necessary.

Further, in the above-mentioned embodiment, as shown in FIG. 17, it is determined whether to carry out the correction operation, in a case where a job of forming and outputting an image or images is input, as an example. Alternatively, the determination as to whether the correction is necessary may be carried out when power supply in the image forming apparatus 1 is started, the image forming apparatus 1 is returned from a power saving mode, or similar times. In this case, since input of a job of forming and outputting an image or images is not a precondition, the process of step S1703 of FIG. 17 is omitted, and thus, in a case of the monochrome preference mode, the process proceeds directly to step S1704.

Further, in the above-mentioned embodiment, as described above with reference to FIGS. 14 and 19, the count value of the number of sheets of forming and outputting images is used as the information indicating the progress having occurred since the correction operation was carried out last or the progress having occurred since the adjustment of the amounts of light was carried out last, and the thresholds are provided for the count value of the number of sheets of forming and outputting images. However, an embodiment of the present invention is not limited to this configuration. The information indicating the progress is not limited to the count value of the number of sheets of forming and outputting images, and any other information may be applied to the information indicating the progress, as long as the progress is determined which has occurred since the correction operation was carried out last or the adjustment of the amounts of light was carried out last. For example, information indicating an elapsed period of time such as actual time, the number of clock pulses of a clock that operates in the image forming apparatus 1, or such, may be applied as the information indicating the progress.

The present invention is not limited to the specifically disclosed embodiments, and variations and modifications may be made without departing from the scope of the present invention.

The present application is based on Japanese priority application No. 2010-061002 filed on Mar. 17, 2010, the entire contents of which are hereby incorporated herein by reference.

What is claimed is:

1. An optical writing control apparatus that controls a light source emitting a light beam onto a photosensitive member to cause the light source to draw an electrostatic latent image on the photosensitive member in an image forming apparatus that develops the electrostatic latent image drawn on the photosensitive member and forms an image, the optical writing control apparatus comprising:

a parameter correction part that controls the light source to cause the light source to emit the light beam and draw a correction pattern used for a correction operation of correcting a parameter value of an image forming mechanism of the image forming apparatus, detects the correction pattern transferred onto a surface of a conveyance member based on an output signal of a sensor that obtains imaging information of the surface of the conveyance member onto which an image developed on the photosensitive member is transferred, and corrects the parameter value based on the detected correction pattern;

a progress information storage part that stores chromatic color progress information indicating a progress having occurred from when the correction operation for a chromatic color mechanism of the image forming mechanism corresponding to a chromatic color image was carried out and achromatic color progress information indicating a progress having occurred from when the correction operation for an achromatic color mechanism of the image forming mechanism corresponding to an achromatic color image was carried out; and a threshold storage part that stores a necessary threshold used to determine that the correction operation is necessary and an unnecessary threshold used to determine that the correction operation is unnecessary, with respect to the chromatic color progress information and the achromatic color progress information, wherein the parameter correction part determines whether the correction operation is necessary separately for the respective ones of the chromatic color mechanism and the achromatic color mechanism by comparing the respective ones of the chromatic color progress information and the achromatic color progress information with the necessary threshold, and it is determined that the correction operation is necessary for both of the chromatic color mechanism and the achromatic color mechanism in a case where any one of the chromatic color progress information and the achromatic color progress information has become equal to or more than the necessary threshold and the other has a value between the unnecessary threshold and the necessary threshold.

2. The optical writing control apparatus as claimed in claim 1, wherein the parameter correction part determines, in a case where the image forming apparatus operates in an achromatic color preference mode in which a chromatic color image is converted into an achromatic color image and the achromatic color image is output, that the correction operation is necessary only for the achromatic color mechanism even in the case where the achromatic color progress information has become equal to or more than the necessary threshold and the chromatic color progress information has a value between the unnecessary threshold and the necessary threshold.

3. The optical writing control apparatus as claimed in claim 2, wherein the parameter correction part determines, in a case where the image forming apparatus operates in the achromatic color preference mode and a page of an achromatic color image is to be output subsequently, that the correction operation is necessary only for the achromatic color mechanism even in the case where the achromatic color progress information has become equal to or more than the necessary threshold and the chromatic color progress information has a value between the unnecessary threshold and the necessary threshold.

4. The optical writing control apparatus as claimed in claim 1, wherein the correction operation is carried out when an image is formed and output in the image forming apparatus, and the parameter correction part has a function of adjusting an amount of light of a sensor light source of a sensor that obtains imaging information of the surface of the conveyance member, the sensor light source irradiating the surface of the conveyance member, and a function of continuously turning on the sensor light source for a predetermined period of time after the completion of the image being formed and output in the image forming apparatus, and carries out adjusting of the amount of light of the sensor light source in a case where the sensor light source having been turned off is turned on when the correction operation is carried out.

5. The optical writing control apparatus as claimed in claim 4, wherein when the correction operation is carried out, the parameter correction part carries out the adjusting of the amount of light of the sensor light source in a case where the sensor light source has been turned on and light amount adjustment progress information that indicates a progress having occurred after adjusting of the amount of light of the sensor light source was carried out last has become equal to or more than a predetermined threshold.

6. The optical writing control apparatus as claimed in claim 1, wherein the correction operation is carried out when an image is formed and output in the image forming apparatus, and when the correction operation is carried out when an image is formed and output in the image forming apparatus, the parameter correction part carries out adjusting of the amount of light of the sensor light source in a case where a job of forming and outputting an image for which adjusting of the amount of light of the sensor light source was carried out last is different from a job of forming and outputting an image for which the current correction operation is carried out.

7. The optical writing control apparatus as claimed in claim 6, wherein when the correction operation is carried out when an image is formed and output in the image forming apparatus, the parameter correction part carries out adjusting of the amount of light of the sensor light source in a case where a job of forming and outputting an image for which adjusting of the amount of light of the sensor light source was carried out last and a job of forming and outputting an image for which the current correction operation is carried out are included in a series of jobs, and light amount adjustment progress information that indicates a progress having occurred after adjusting of the amount of light of the sensor light source was carried out last has become equal to or more than a predetermined threshold.

8. The optical writing control apparatus as claimed in claim 1, wherein the correction operation is carried out when an image is formed and output in the image forming apparatus, and the parameter correction part includes a function of adjusting an amount of light of a sensor light source of the sensor that obtains imaging information of the surface of the conveyance member, the sensor light source irradiating the surface of the conveyance member, and a function of continuously turning on of the sensor light source for a predetermined period of time after the completion of the image being formed and output in the image forming apparatus, when the correction operation is carried out, the parameter correction part carries out adjusting of the amount of light of the sensor light source in a case where the sensor light source has been turned on and light amount adjustment progress information that indicates a progress having occurred after adjusting of the amount of light of the sensor light source was carried out last has become equal to or more than a first predetermined threshold, when the correction operation is carried out when an image is formed and output in the image forming apparatus, the parameter correction part carries out adjusting of the amount of light of the sensor light source in a case where a job of forming and outputting an image for which adjusting of the amount of light of the sensor light source was carried out last and a job of forming and outputting an image for which the current correction operation is carried out are included in a series of jobs, and the light amount adjustment progress information that indicates the progress having occurred after adjusting of the amount of light of the sensor light source was carried out last has become equal to or more than a second predetermined threshold, and the first predetermined threshold is smaller than the second predetermined threshold.

9. The optical writing control apparatus as claimed in claim 1, wherein the parameter correction part corrects the parameter value of timing of causing the light source to emit light based on a period of time from when drawing of the correction pattern is started up to when the correction pattern is detected from the output signal of the sensor.

10. The optical writing control apparatus as claimed in claim 1, wherein the parameter correction part corrects the parameter value of a voltage to be applied for developing the electrostatic latent image drawn on the photosensitive member based on density of the detected correction pattern.

11. The optical writing control apparatus as claimed in claim 1, wherein the parameter correction part corrects the parameter value of timing of causing the light source to emit light based on a period of time from when drawing of the correction pattern is started up to when the correction pattern is detected from the output signal of the sensor, the parameter correction part corrects the parameter value of a voltage to be applied for developing the electrostatic latent image drawn on the photosensitive member based on density of the detected correction pattern, and the necessary threshold used to determine that the correction operation to correct the parameter of the timing is necessary is smaller than the necessary threshold used to determine that the correction operation to correct the parameter of the voltage is necessary.

12. The optical writing control apparatus as claimed in claim 11, wherein the parameter correction part determines that the correction operation to correct the parameter of the timing is necessary when having determined that the correction operation to correct the parameter of the voltage is necessary.

13. An image forming apparatus including the optical writing control apparatus claimed in claim 1.

14. A control method of an optical writing control apparatus that controls a light source emitting a light beam onto a photosensitive member to cause the light source to draw an electrostatic latent image on the photosensitive member in an image forming apparatus that develops the electrostatic latent image drawn on the photosensitive member and forms an image, the control method of the optical writing control apparatus comprising:

controlling the light source to cause the light source to emit the light beam and draw a correction pattern used for a correction operation of correcting a parameter value of an image forming mechanism in the image forming apparatus, detecting the correction pattern transferred onto a surface of a conveyance member based on an output signal of a sensor that obtains imaging information of the surface of the conveyance member onto which an image developed on the photosensitive member is transferred, and correcting the parameter value based on the detected correction pattern;

storing chromatic color progress information indicating a progress having occurred from when the correction operation for a chromatic color mechanism of the image forming mechanism corresponding to a chromatic color image was carried out and achromatic color progress information indicating a progress having occurred from when the correction operation for an achromatic color mechanism of the image forming mechanism corresponding to an achromatic color image was carried out;

storing a necessary threshold used to determine that the correction operation is necessary and an unnecessary threshold used to determine that the correction operation is unnecessary, with respect to the chromatic color progress information and the achromatic color progress information, determining whether the correction operation is necessary separately for the respective ones of the chromatic color mechanism and the achromatic color mechanism by comparing the respective ones of the chromatic color progress information and the achromatic color progress information with the necessary threshold, and determining that the correction operation is necessary for both of the chromatic color mechanism and the achromatic color mechanism in a case where any one of the chromatic color progress information and the achromatic color progress information has become equal to or more than the necessary threshold and the other has a value between the unnecessary threshold and the necessary threshold.

* * * * *